US011367760B2

(12) United States Patent
Kim et al.

(10) Patent No.: US 11,367,760 B2
(45) Date of Patent: Jun. 21, 2022

(54) ELECTRONIC DEVICE INCLUDING DISPLAY AND CAMERA DEVICE

(71) Applicant: Samsung Electronics Co., Ltd., Suwon-si (KR)

(72) Inventors: Il Kim, Suwon-si (KR); Heecheul Moon, Suwon-si (KR); Sungyoung Shin, Suwon-si (KR); Hyunwoo Sim, Suwon-si (KR); Minsuk Uhm, Suwon-si (KR); Sunggoo Her, Suwon-si (KR); Taesang Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 94 days.

(21) Appl. No.: 17/028,019

(22) Filed: Sep. 22, 2020

(65) Prior Publication Data
US 2021/0091148 A1    Mar. 25, 2021

(30) Foreign Application Priority Data

Sep. 23, 2019   (KR) ........................ 10-2019-0116615

(51) Int. Cl.
    *H01L 27/32*     (2006.01)
    *H01L 27/14*     (2006.01)
    (Continued)

(52) U.S. Cl.
    CPC ............ *H01L 27/3234* (2013.01); *G02B 7/09* (2013.01); *G03B 13/36* (2013.01);
    (Continued)

(58) Field of Classification Search
    CPC ............ H01L 27/3234; H01L 27/3244; H01L 27/14623; H01L 51/5253; H01L 51/5246; G02B 7/09; G02B 1/11; G03B 13/36
    See application file for complete search history.

(56) References Cited

U.S. PATENT DOCUMENTS

| 4,232,512 | A  | * | 11/1980 | Yoshikawa | ............ G04G 17/02 368/276 |
| 8,078,047 | B2 | * | 12/2011 | Shintani | ............ H01L 27/14685 396/311 |
| 8,913,170 | B1 |   | 12/2014 | Baldwin |  |
| 8,947,627 | B2 |   | 2/2015  | Rappoport et al. |  |

(Continued)

FOREIGN PATENT DOCUMENTS

| CN | 108628043 A | 10/2018 |
| KR | 10-2007-0080391 A | 8/2007 |
| KR | 10-2018-0136386 A | 12/2018 |

OTHER PUBLICATIONS

International Search Report dated Jan. 11, 2021, issued in International Application No. PCT/KR2020/012765.

*Primary Examiner* — Ida M Soward
(74) *Attorney, Agent, or Firm* — Jefferson IP Law, LLP

(57) ABSTRACT

An electronic device is provided. The electronic device includes a transparent plate, a display disposed under the transparent plate and including an opening, an optical sensor aligned under the opening, a transparent body that is extended from a first surface facing the transparent plate to a second surface disposed on an opposite side of the first surface and facing the optical sensor, and is at least partially disposed in the opening, and a light shielding film disposed on a side surface of the transparent body between the first surface and the second surface. It is possible to provide various other embodiments.

30 Claims, 18 Drawing Sheets

(51) Int. Cl.
    *H01L 51/52*     (2006.01)
    *G02B 7/09*     (2021.01)
    *G02B 1/11*     (2015.01)
    *G03B 13/36*     (2021.01)
    *H02K 41/035*     (2006.01)
    *H01L 27/146*     (2006.01)
    *H02K 11/21*     (2016.01)

(52) U.S. Cl.
    CPC ...... *H01L 27/3244* (2013.01); *H01L 51/5253* (2013.01); *G02B 1/11* (2013.01); *H01L 27/1462* (2013.01); *H01L 27/14623* (2013.01); *H01L 27/14627* (2013.01); *H01L 51/5246* (2013.01); *H02K 11/21* (2016.01); *H02K 41/0356* (2013.01)

(56) References Cited

U.S. PATENT DOCUMENTS

| | | | |
|---|---|---|---|
| 11,172,577 B2 * | 11/2021 | Wang | H05K 1/147 |
| 2016/0029511 A1 * | 1/2016 | Jung | H01L 23/42 |
| | | | 361/700 |
| 2018/0067212 A1 | 3/2018 | Wilson et al. | |
| 2018/0081100 A1 | 3/2018 | Wang et al. | |
| 2018/0323320 A1 | 11/2018 | Mehrl et al. | |
| 2018/0364869 A1 | 12/2018 | Lee et al. | |
| 2019/0080668 A1 * | 3/2019 | Holenarsipur | G01J 1/4204 |
| 2019/0086717 A1 * | 3/2019 | Lee | H04M 1/0266 |
| 2019/0243417 A1 * | 8/2019 | Cheng | G06F 1/1626 |
| 2019/0259351 A1 | 8/2019 | Yoon et al. | |
| 2019/0296266 A1 * | 9/2019 | Kim | G06K 9/2036 |

* cited by examiner

ELECTRONIC DEVICE INCLUDING DISPLAY AND CAMERA DEVICE

CROSS-REFERENCE TO RELATED APPLICATION(S)

This application is based on and claims priority under 35 U.S.C. § 119(a) of a Korean patent application number 10-2019-0116615, filed on Sep. 23, 2019, in the Korean Intellectual Property Office, the disclosure of which is incorporated by reference herein in its entirety.

BACKGROUND

1. Field

The disclosure relates to an electronic device including a display and a camera device.

2. Description of Related Art

A recent trend for electronic devices such as smartphones is to increase a screen size. This may be understood as an attempt to increase the immersiveness by filling the front surface of an electronic device with the screen. Because the size of an electronic device cannot be increased to a level that is uncomfortable to use with one hand, the design that maximizes the screen relative to a preset size of the electronic device is pursued. In addition, a front camera frequently used for self-portrait shots (e.g., selfie) or video calls is an integral part of an electronic device such as a smartphone. As the bezel (periphery) surrounding the screen is minimized, there is not enough space to place the front camera outside a periphery of the screen. As an effort to maximize the screen and place the front camera on the screen, a method of filling the front surface with the display except for the camera hole has been recently used.

The above information is presented as background information only to assist with an understanding of the disclosure. No determination has been made, and no assertion is made, as to whether any of the above might be applicable as prior art with regard to the disclosure.

SUMMARY

To slim the electronic device, the aperture of a camera may be disposed as close as possible to the front surface through the camera hole. The camera hole may be formed larger than the size required by the camera taking into account the mechanism structure of the body tube and the tolerances for the manufacturing process, but this can conflict with screen maximization.

Aspects of the disclosure are to address at least the above-mentioned problems and/or disadvantages and to provide at least the advantages described below. Accordingly, an aspect of the disclosure is to provide an electronic device including a display and camera device capable of supporting the largest possible screen by reducing the size of the camera hole.

Additional aspects will be set forth in part in the description which follows and, in part, will be apparent from the description, or may be learned by practice of the presented embodiments.

In accordance with an aspect of the disclosure, an electronic device is provided. The electronic device includes a transparent plate, a display disposed under the transparent plate and including an opening, an optical sensor aligned under the opening, a transparent body extending from a first surface facing the transparent plate to a second surface disposed on an opposite side of the first surface and facing the optical sensor, and at least partially disposed in the opening, and a light shielding film disposed on a side surface of the transparent body between the first surface and the second surface.

In various embodiments of the disclosure, it is possible to form the largest possible screen by reducing the size of the camera hole while securing the light reception and detection performance of the camera device.

Other effects that can be obtained or predicted due to the disclosure will be disclosed explicitly or implicitly in the detailed description of the embodiments of the disclosure. For example, various effects predicted according to various embodiments of the disclosure will be disclosed in the following detailed description.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
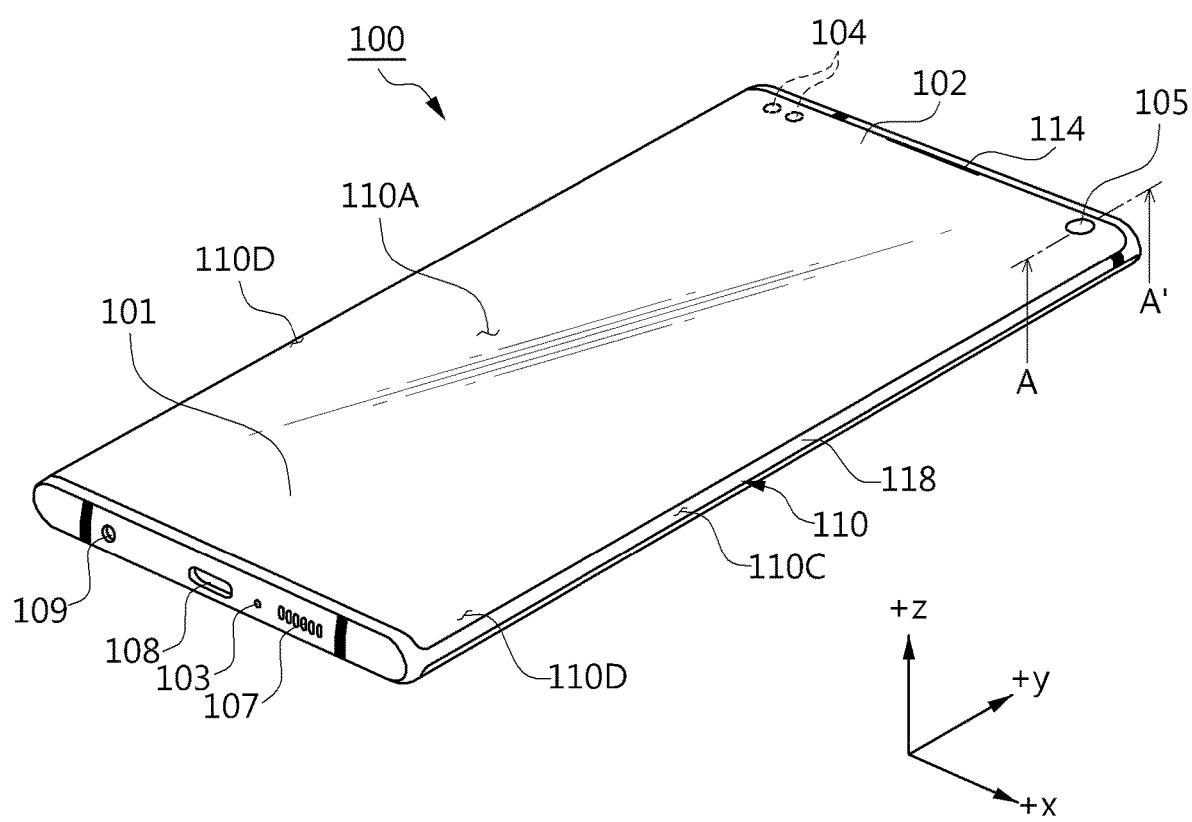
FIG. 1A is a front perspective view of a mobile electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C" may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

FIG. 1A is a perspective view illustrating a front surface of a mobile electronic device 100 according to an embodiment of the disclosure.

Figure 1B:
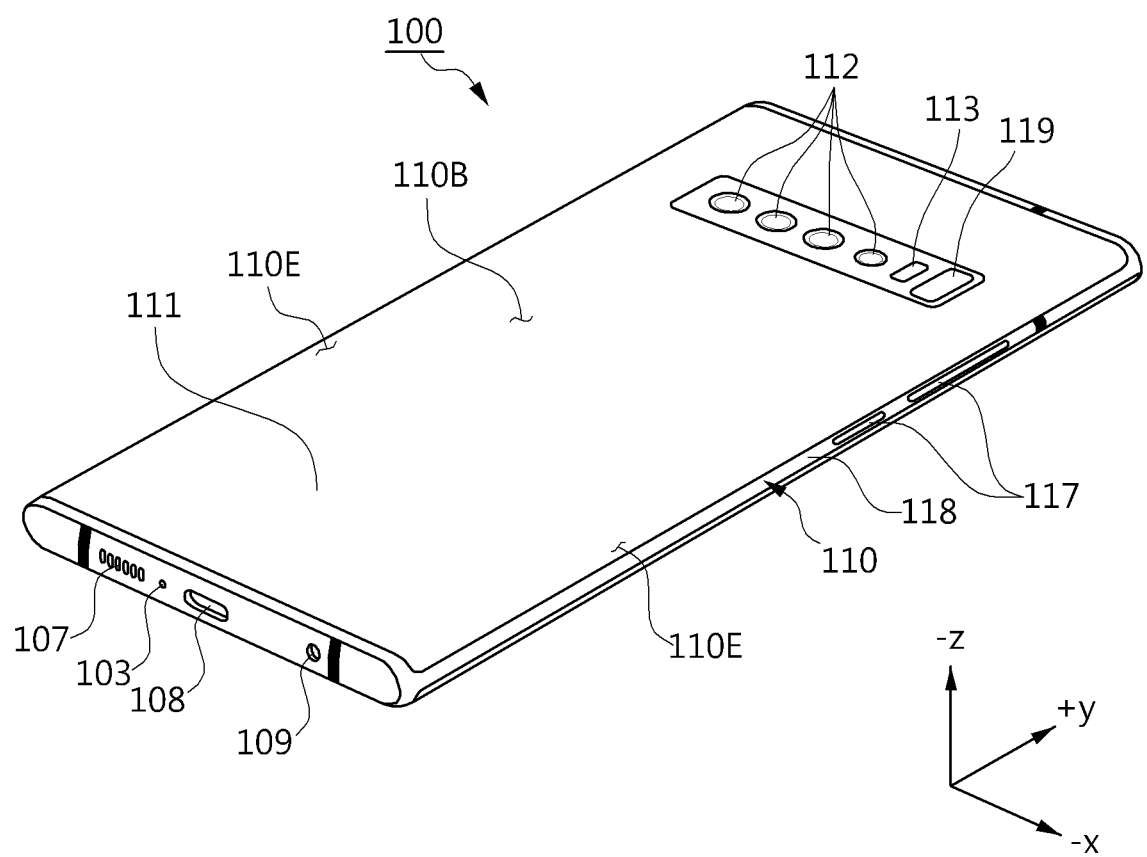
FIG. 1B is a rear perspective view of the electronic device of FIG. 1A according to an embodiment of the disclosure.

FIG. 1B is a perspective view illustrating a rear surface of the electronic device 100 of FIG. 1A according to an embodiment of the disclosure.

Referring to FIGS. 1A and 1B, according to an embodiment, an electronic device 100 may include a housing 110 that includes a first surface (or front surface) 110A, a second surface (or rear surface) 110B, and a lateral surface 110C that surrounds a space between the first surface 110A and the second surface 110B. According to another embodiment, the housing 110 may refer to a structure that forms a part of the first surface 110A, the second surface 110B, and the lateral surface 110C. According to an embodiment, the first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. In some embodiments, the rear plate 111 and the lateral bezel structure 118 may be integrally formed and may be of the same material (e.g., a metallic material such as aluminum).

In the shown embodiment, the front plate 102 may include two first regions 110D disposed at long edges thereof, respectively, and bent and extended seamlessly from the first surface 110A toward the rear plate 111. In the shown embodiment, the rear plate 111 may include two second regions 110E disposed at long edges thereof, respectively, and bent and extended seamlessly from the second surface 110B toward the front plate 102 (refer to FIG. 1B). In various embodiments, the front plate 102 (or the rear plate 111) may include only one of the first regions 110D (or of the second regions 110E). In various embodiments, the first regions 110D or the second regions 110E may be omitted in part. In the embodiments, when viewed from a lateral side of the electronic device 100, the lateral bezel structure 118 may have a first thickness (or width) on a lateral side where one of the first regions 110D or one of the second regions 110E is not included, and may have a second thickness, being less than the first thickness, on another lateral side where one of the first regions 110D or one of the second regions 110E is included.

According to an embodiment, the electronic device 100 may include at least one of a display 101, audio modules 103, 107 and 114, sensor modules 104 and 119, camera modules 105, 112 and 113, key input devices 117, and connector holes 108 and 109. In various embodiments, the electronic device 100 may omit at least one (e.g., the key input devices 117) of the above components, or may further include other components (e.g., a fingerprint sensor or a light emitting device).

The display 101 may be exposed through a substantial portion of the front plate 102, for example. In various embodiments, at least a part of the display 101 may be exposed through the front plate 102 that forms the first surface 110A and the first regions 110D. In various embodiments, outlines (i.e., edges and corners) of the display 101 may have substantially the same form as those of the front plate 102. In another embodiment (not shown), the spacing between the outline of the display 101 and the outline of the front plate 102 may be substantially unchanged in order to enlarge the exposed area of the display 101.

In another embodiment (not shown), a recess or opening may be formed in a portion of a display area of the display 101 to accommodate or to be aligned with at least one of audio modules (e.g., the audio module 114), sensor module (e.g., the sensor module 104), and camera modules (e.g., the camera module 305). In another embodiment (not shown), at least one of the audio modules (e.g., the audio module 114), the sensor modules (e.g., the sensor module 104), and the camera modules (e.g., the camera module 105) may be disposed on the back of the display area of the display 101. In another embodiment (not shown), the display 101 may be combined with, or adjacent to, a touch sensing circuit, a pressure sensor capable of measuring the touch strength (pressure), and/or a digitizer for detecting a stylus pen. In various embodiments, at least a part of the sensor modules 104 and 119 and/or at least a part of the key input devices 117 may be disposed in one of the first regions 110D and/or one of the second regions 110E.

The audio modules 103, 107 and 114 may correspond to a microphone hole (e.g., the audio module 103) and speaker holes (e.g., the audio modules 107 and 114). The microphone hole may contain a microphone disposed therein for acquiring external sounds and, in a case, contain a plurality of microphones to sense a sound direction. The speaker holes may be classified into an external speaker hole and a call receiver hole. In various embodiments, the microphone hole and the speaker holes may be implemented as a single hole, or a speaker (e.g., a piezo speaker) may be provided without the speaker holes.

The sensor modules 104 and 119 may generate electrical signals or data corresponding to an internal operating state of the electronic device 100 or to an external environmental condition. The sensor modules 104 and 119 may include a first sensor module (e.g., the sensor module 104) (e.g., a proximity sensor) and/or a second sensor module (e.g., a fingerprint sensor) disposed on the first surface 110A of the housing 110, and/or a third sensor module (e.g., the sensor module 119) (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor (e.g., the sensor module 104).

The camera modules 105, 112 and 113 may include a first camera device (e.g., the camera module 105) disposed on the first surface 110A of the electronic device 100, and a second camera device (e.g., the camera module 112) and/or a flash (e.g., the camera module 113) disposed on the second surface 110B of the electronic device 100. The camera module 105 or the camera module 112 may include one or more lenses, an image sensor, and/or an image signal processor. The flash may include, for example, a light emitting diode or a xenon lamp. In various embodiments, two or more lenses (infrared cameras, wide angle and telephoto lenses) and image sensors may be disposed on one side of the electronic device 100.

The key input devices 117 may be disposed on the lateral surface 110C of the housing 110. In another embodiment, the electronic device 100 may not include some or all of the key input devices 117 described above, and the key input devices 117 which are not included may be implemented in another form such as a soft key on the display 101. In various embodiments, the key input devices 117 may include a sensor module (not shown) disposed on the second surface 110B of the housing 110.

The light emitting device (not shown) may be disposed on the first surface 110A of the housing 110, for example. For example, the light emitting device may provide status information of the electronic device 100 in an optical form. In various embodiments, the light emitting device may provide a light source associated with the operation of the camera module 105. The light emitting device may include, for example, a light emitting diode (LED), an infrared (IR) LED, or a xenon lamp.

The connector holes 108 and 109 may include a first connector hole (e.g., the connector hole 108) adapted for a connector (e.g., a universal serial bus (USB) connector) for transmitting and receiving power and/or data to and from an external electronic device, and/or a second connector hole (e.g., the connector hole 109) adapted for a connector (e.g., an earphone jack) for transmitting and receiving an audio signal to and from an external electronic device.

Figure 2:
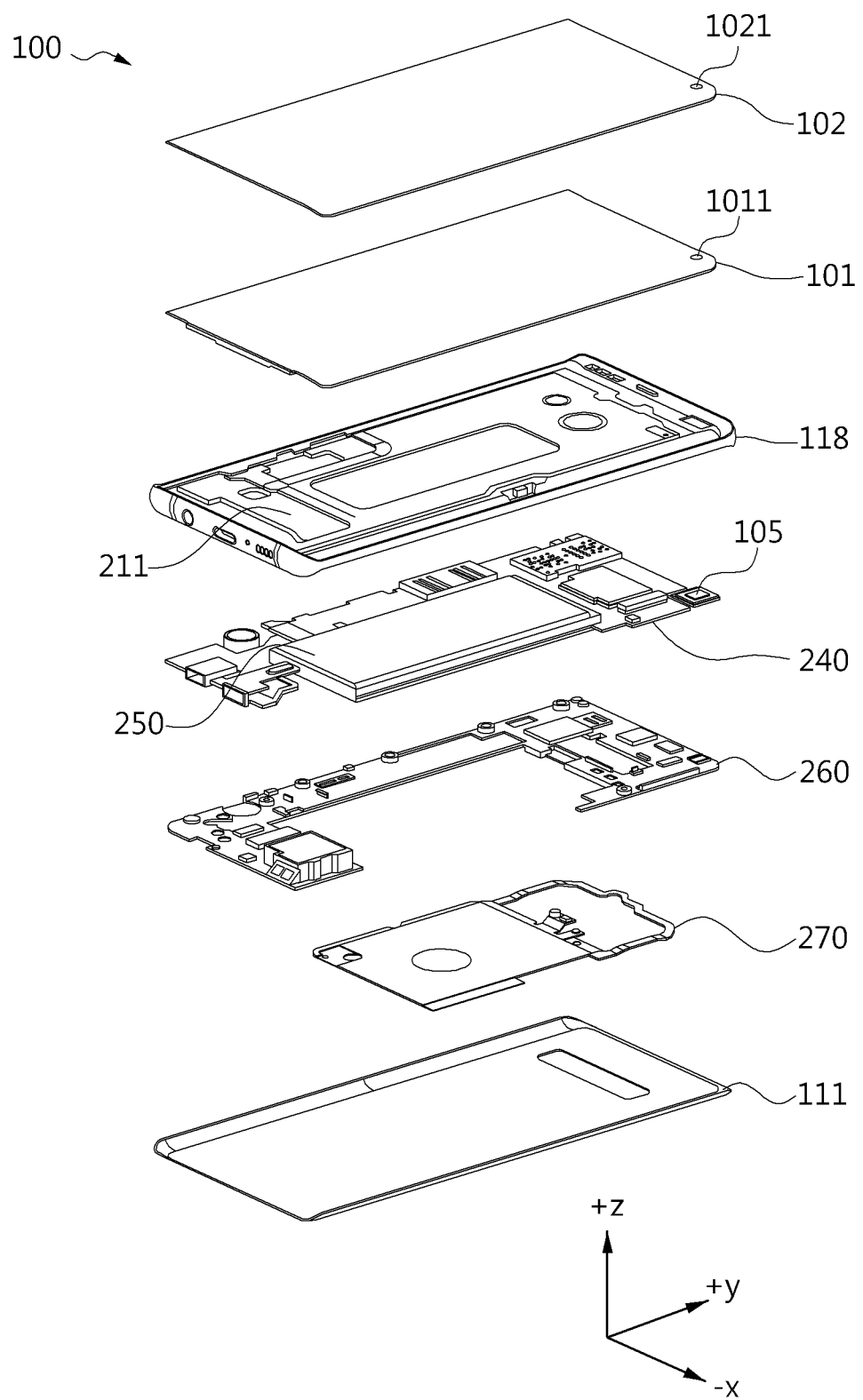
FIG. 2 is an exploded perspective view of the electronic device of FIG. 1A according to an embodiment of the disclosure.

FIG. 2 is an exploded perspective view illustrating the electronic device 100 of FIG. 1A according to an embodiment of the disclosure.

Referring to FIG. 2, the electronic device 100 may include the lateral bezel structure 118, a first support member 211 (e.g., a bracket), the front plate 102, the display 101, a printed circuit board (PCB) 240, a battery 250, a second support member 260 (e.g., a rear case), an antenna 270, and the rear plate 111. In various embodiments, the electronic device 100 may omit at least one (e.g., the first support member 211 or the second support member 260) of the above components or may further include another component. Some components of the electronic device 100 may be the same as or similar to those of the electronic device 100 shown in FIG. 1A or FIG. 1B, thus, descriptions thereof are omitted below.

The first support member 211 is disposed inside the electronic device 100 and may be connected to, or integrated with, the lateral bezel structure 118. The first support member 211 may be formed of, for example, a metallic material and/or a non-metal (e.g., polymer) material. The first support member 211 may be combined with the display 101 at one side thereof and also combined with the PCB 240 at the other side thereof. On the PCB 240, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the electronic device 100 with an external electronic device and may include a USB connector, an SD card/multimedia card (MMC) connector, or an audio connector.

The battery 250 is a device for supplying power to at least one component of the electronic device 100, and may include, for example, a non-rechargeable primary battery, a rechargeable secondary battery, or a fuel cell. At least a part of the battery 250 may be disposed on substantially the same plane as the PCB 240. The battery 250 may be integrally disposed within the electronic device 100, and may be detachably disposed from the electronic device 100.

The second support member 260, for example, may be coupled to the first support member 211, and may be disposed between the printed circuit board 240 and the rear plate 111. The second support member 260 may be coupled to the first support member 211 with the printed circuit board 240 via a joint mean such as a volt. The second support member 260 may cover the printed circuit board 240 to protect. The second support member 260 may be formed of a metallic material and/or a non-metal (e.g., polymer) material.

The antenna 270 may be disposed between the rear plate 111 and the battery 250. The antenna 270 may include, for example, a near field communication (NFC) antenna, a wireless charging antenna, and/or a magnetic secure transmission (MST) antenna. The antenna 270 may perform short-range communication with an external device, or transmit and receive power required for charging wirelessly. In various embodiments, an antenna structure may be formed by a part or combination of the lateral bezel structure 118 and/or the first support member 211.

In various embodiments, the display 101 may include an opening 1011 formed in at least a region corresponding to an optical sensor (e.g., camera module or first camera device 105, or biometric sensor) disposed inside the electronic device 100. The optical sensor may receive external light through a region 1021 of the front plate 102 and the opening 1011 of the display 101 aligned therewith.

In various embodiments (not shown), the electronic device 100 may further include a pen input device (e.g., stylus pen). The pen input device may be guided through a hole formed on the side surface of the housing (e.g., housing 110 in FIG. 1A) for being inserted into or detached from the housing, and may include a button for facilitating insertion or detachment. A separate resonant circuit may be built in the pen input device to interwork with an electromagnetic induction panel included in the electronic device 100. In one embodiment, the pen input device may utilize electromagnetic induction (e.g., electro-magnetic resonance (EMR)). The electromagnetic induction panel (e.g., digitizer) may be a panel for sensing the input of the pen input device, and may be disposed between the display 101 and the first support member 211. In various embodiments, the electromagnetic induction panel may include an opening formed in at least a region corresponding to the optical sensor (e.g., first camera device 105 or biometric sensor) disposed inside the electronic device 100 and the opening 1011 of the display 101. In various embodiments, the pen input device may be implemented by using an electro-magnetic resonance (EMR) scheme, an active electrical stylus (AES), or an electric coupled resonance (ECR) scheme. For example, when the pen input device is implemented using the AES, the electromagnetic induction panel may be omitted.

Figure 3A:
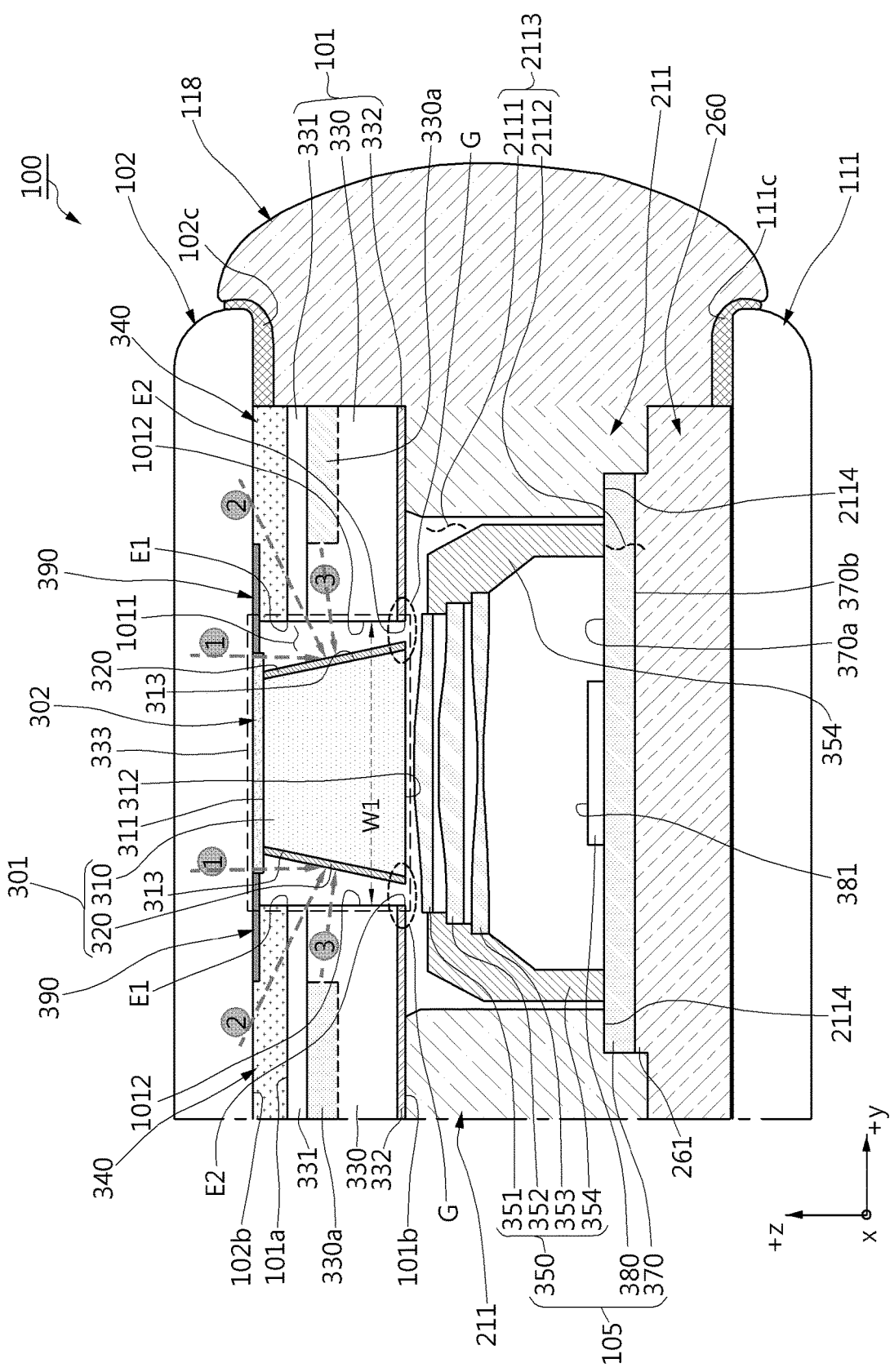
FIG. 3A is a cross-sectional view of the electronic device of FIG. 1A along the line A-A' according to an embodiment of the disclosure.
Figure 3B:
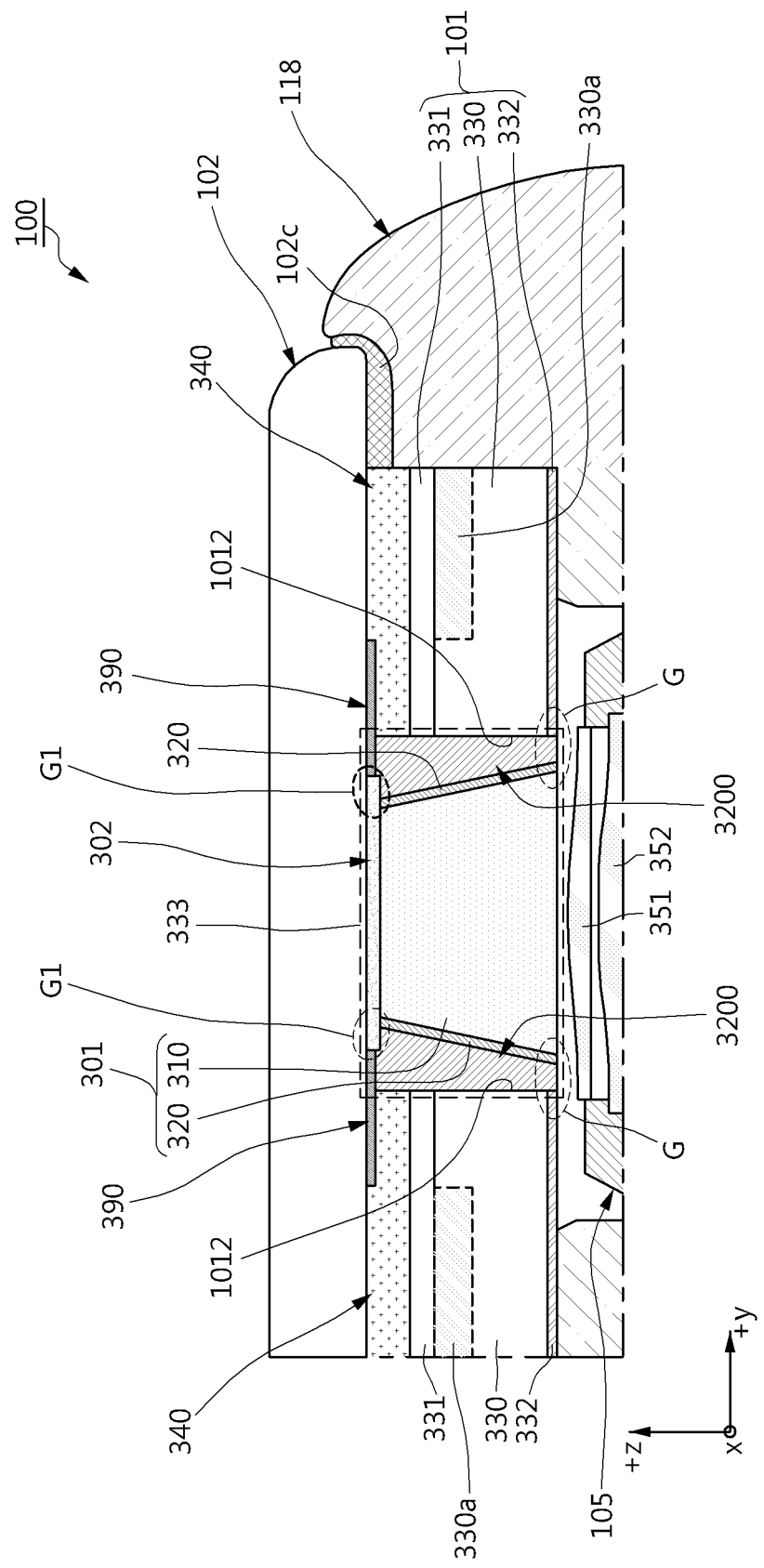
FIG. 3B is a cross-sectional view of the electronic device of FIG. 1A along the line A-A' according to an embodiment of the disclosure.
Figure 4:
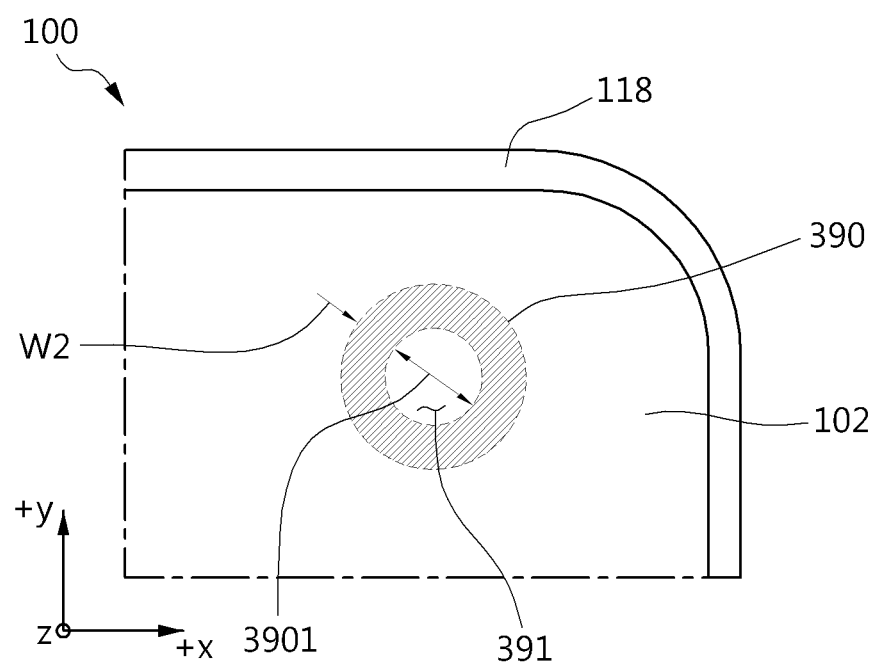
FIG. 4 is a plan view of the electronic device of FIG. 1A according to an embodiment of the disclosure.

FIG. 3A is a cross-sectional view of the electronic device 100 of FIG. 1A along the line A-A' according to an embodiment of the disclosure. FIG. 3B is a cross-sectional view of the electronic device 100 of FIG. 1A along the line A-A' according to an embodiment of the disclosure. FIG. 4 is a plan view of the electronic device 100 of FIG. 1A according to an embodiment of the disclosure.

Referring to FIG. 3A, in one embodiment, the electronic device 100 may include a front plate 102, a rear plate 111, a side member 118, a first support member 211, a second support member 260, a display 101, an aperture structure 301, or a first camera device (referred to as "camera device") 105. In various embodiments, some components of the electronic device 100 in FIG. 3A may be identical or similar to some of the components in FIG. 2, and repeated descriptions are omitted.

In one embodiment, the rim (not shown) of the front plate 102 can be coupled with the side member 118 through an adhesive member 102c such as double-sided tape. The rim (not shown) of the rear plate 111 may be coupled with the side member 118 through an adhesive member 111c such as double-sided tape. The first support member 211, the second support member 260, the display 101, the aperture structure 301, and the camera device 105 may be arranged in the internal space of the housing (e.g., housing 110 in FIG. 1A) composed of the front plate 102, the rear plate 111, and the side member 118.

In one embodiment, the display 101 may be disposed between the first support member 211 and the front plate 102, and may be combined with the front plate 102. An optically transparent adhesive member 340 such as an optically clear adhesive (OCA) may be disposed between the front plate 102 and the display 101. In one embodiment, the front plate 102 and the display 101 may be combined without an air gap through the optically transparent adhesive member 340. The optically transparent adhesive member 340 may improve image quality. For example, assuming that there is an air gap between the front plate 102 and the display 101, some of the light output from the display 101 may be reflected and lost instead of travelling straight to the front plate 102 due to the difference in the refractive index between different media (e.g., front plate 102, air gap, and display 101). The loss of light due to the air gap may blur the image through the screen (e.g., effective area for displaying an image in an apparatus composed of the display 101 and the front plate 102), causing deterioration of the image quality. When the air gap between the front plate 102 and the display 101 is filled with the optically transparent adhesive member 340, the difference in refractive index between the optically transparent adhesive member 340 and the medium layer in contact therewith can be minimized. When the difference in refractive index between the optically transparent adhesive member 340 and the medium layer in contact therewith is minimized, the reflectivity of the interface between the optically transparent adhesive member 340 and the medium layer in contact therewith may be lowered. When the reflectivity of the interface between the optically transparent adhesive member 340 and the medium layer in contact therewith is lowered, as it is possible to reduce the reflection at the interface and the resulting loss of light, a clear image can be represented through the screen.

In one embodiment, the display 101 may include an opening 1011 formed to penetrate between the front plate 102 and the camera device 105. The optically transparent adhesive member 340 may not extend between the front plate 102 and the opening 1011. The structure composed of the front plate 102, the display 101, and the optically transparent adhesive member 340 may include a recess 333 caved in the direction from the rear plate 111 to the front plate 102 due to the opening 1011.

The display 101 may include a third surface 101a that is bonded to the front plate 102 through, e.g., an optically transparent adhesive member 340, and a fourth surface 101b that is substantially parallel to the third surface 101a on the opposite side of the third surface 101a. The opening 1011 may include a first edge E1 formed on the third surface 101a, a second edge E2 formed on the fourth surface 101b, and an inner side surface 1012 connecting the first edge E1 and the second edge E2. In one embodiment, when viewed from above the front plate 102, the first edge E1 may form a circle. When viewed from above the rear plate 111, the second edge E2 may form a circle overlapping the first edge E1. The inner side surface 1012 may be a curved surface formed along the first edge E1 and the second edge E2. The inner side surface 1012 may be perpendicular to the third surface 101a or the fourth surface 101b. In one embodiment, the recess 333 may be a cylindrical space.

In various embodiments (not shown), the second edge E2 may form a circle with a larger diameter than the first edge E1 when viewed from above the front plate 102. The opening 1011 may have a shape that narrows from the second edge E2 to the first edge E1. The opening 1011 may become narrower when going from the second edge E2 to the first edge E1. For example, the inner side surface 1012 may be formed as an inclined surface making an acute angle with the third surface 101a and making an obtuse angle with the fourth surface 101b. For another example, the inner side surface 1012 may be implemented in the form of steps.

In one embodiment, the display 101 (or, display panel) may include a light emitting layer 330, and an optical layer 331 and back plate 332 disposed with the light emitting layer 330 therebetween. An optically transparent adhesive member (not shown) such as OCA may be disposed between the light emitting layer 330 and the optical layer 331. An adhesive member (not shown) of various polymers may be disposed between the light emitting layer 330 and the back plate 332.

The light emitting layer 330 may include a plurality of pixels 330a implemented with light emitting elements such as organic light emitting diodes (OLED). The area in which the plural pixels 330a are disposed may constitute a screen being an effective area capable of representing an image. The light emitting layer 330 may include at least one thin film transistor (TFT) for controlling the plural pixels 330a. The at least one TFT may control the current of a light emitting element to turn on or off a pixel or adjust brightness of the pixel. The at least one TFT may be implemented with, for example, an amorphous silicon (a-Si) TFT, or a low-temperature polycrystalline silicon (LTPS) TFT. The light emitting layer 330 may include a storage capacitor, and the storage capacitor can maintain the voltage signal in the pixel, maintain the voltage applied to the pixel within one frame, or reduce a change in the gate voltage of the TFT due to leakage current during the light emission time. By using a routine (e.g., initialization or data write) that controls at least one TFT, the storage capacitor can maintain the voltage applied to the pixel at regular time intervals.

The optical layer 331 may be disposed between, for example, the light emitting layer 330 and the front plate 102 to improve the image quality of the screen. In one embodiment, the optical layer 331 may include a phase retardation layer (or, retarder) and a polarizing layer (or, polarizer) disposed between the phase retardation layer and the front plate 102. When unpolarized light such as sunlight passes through the front plate 102 and the optically transparent adhesive member 340 and enters the display 101, the unpolarized light may pass through the polarizing layer and become linearly polarized light, and the linearly polarized light may pass through the phase retardation layer and become circularly polarized light. For example, when the unpolarized light passes through the 90-degrees polarizing layer, it becomes 90-degrees linearly polarized light; and when the 90-degrees linearly polarized light passes through the 45-degrees phase retardation layer, it becomes circularly polarized light whose polarization axis rotates. The phase retardation layer may have characteristics of a quarter wave retarder ($\lambda/4$ retarder). For example, when sunlight passes through the front plate 102 and the optically transparent adhesive member 340 and enters the display 101, most of the sunlight may be reflected by a metal such as an electrode included in the light emitting layer 330, which may make it difficult for the user to recognize the screen. In one embodiment, the polarizing layer and the phase retardation layer may improve outdoor visibility by preventing light incident from the outside from being reflected outward. For example, the circularly polarized light changed by the phase retardation layer having characteristics of the quarter wave retarder ($\lambda/4$ retarder) is reflected by the light emitting layer 330, and the reflected circularly polarized light passes through the phase retardation layer with a total of $\lambda/2$ phase shift, which then becomes linearly polarized light perpendicular to the initial polarization of 90 degrees. This 180-degrees linearly polarized light cannot be emitted outside through the 90-degrees polarizing layer. In various embodiments, the polarizing layer and the phase retardation layer may be combined into one layer, which may be referred to as a "circularly polarizing layer."

The back plate 332 may be disposed on, for example, the rear surface of the light emitting layer 330 to constitute at least some of the fourth surface 101b. The back plate 332 may support and protect the light emitting layer 330. The back plate 332 may include a material capable of absorbing or shielding external light, or light or electromagnetic waves generated from the light emitting layer 330. In one embodiment, the back plate 332 may be made of various metal materials such as copper. In various embodiments, the back plate 332 may be made of a material such as graphite, and may serve as a heat spreader for diffusing, dispersing, or dissipating heat emitted from the display 101.

In various embodiments (not shown), the display 101 may include a touch sensing circuit (e.g., touch sensor). The touch sensing circuit may be implemented with a transparent conductive layer (or film) made of various conductive materials such as indium tin oxide (ITO). In one embodiment, the touch sensing circuit may be disposed between the front plate 102 and the optical layer 331 (e.g., add-on type). In another embodiment, the touch sensing circuit may be disposed between the optical layer 331 and the light emitting layer 330 (e.g., on-cell type). In another embodiment, the light emitting layer may include a touch sensing circuit or a touch sensing function (e.g., in-cell type).

In various embodiments (not shown), the display 101 may be based on OLEDs, and may include an encapsulation layer disposed between the light emitting layer 330 and the optical layer 331. Organic materials and electrodes that emit light in the OLEDs can react very sensitively to oxygen and/or moisture and lose luminescence properties. In one embodiment, the encapsulation layer may seal the light emitting layer 330 so that oxygen and/or moisture do not permeate the OLEDs. In one embodiment, the encapsulation layer may be expanded to cover the inner side surface 1012 of the opening 1011.

In various embodiments, the display 101 may be implemented with a flexible display based on a substrate (e.g., plastic substrate) made of a flexible material such as polyimide (PI). The flexible display may be based on OLEDs, and the encapsulation layer may be implemented with, for example, thin-film encapsulation (TFE). In various embodiments, the flexible display may include a conductive pattern such as a metal mesh (e.g., aluminum metal mesh) as a touch sensing circuit disposed on the encapsulation layer and the optical layer 331. For example, in response to the bending of the flexible display, the metal mesh may have greater durability compared with a transparent conductive layer made of ITO.

In various embodiments (not shown), the display 101 may further include a pressure sensor capable of measuring the intensity (pressure) of a touch.

In various embodiments (not shown), the display 101 may further include various components according to its provision options. Such components may be not all enumerated due to various variations according to the convergence trend of the display 101, but another component comparable to the aforementioned components may be included in the display 101. In various embodiments, a specific one of the above-described components of the display 101 may be excluded or be replaced with a comparable component according to the provision options.

In one embodiment, the aperture structure 301 may be disposed between the front plate 102 and the camera device 105. The aperture structure 301 may determine the amount of light passing through plural lenses 351, 352 and 353 of the camera device 105. In one embodiment, the aperture structure 301 may include a transparent body (or, transparent medium) 310 and a light shielding film 320.

In one embodiment, the transparent body 310 may refer to a medium whose degree of light transmission is very large compared to that of reflection or absorption and whose transmittance is very high. The transparent body 310 may indicate a medium that transmits light while minimizing absorption or scattering when the light travels through the medium. For example, the transparent body 310 may be made of various materials such as glass and acrylic.

In one embodiment, the transparent body 310 may include a first surface 311 facing the front plate 102, and a second surface 312 disposed to face the plural lenses 351, 352, and 353 of the camera device 105 on the opposite side of the first surface 311. The first surface 311 and the second surface 312 may be substantially parallel to each other. The transparent body 310 may be of a form extended from the first surface 311 to the second surface 312 and be disposed at least partially in the recess 333. In one embodiment, the transparent body 310 may have a cylindrical shape tapering in the direction from the second surface 312 to the first surface 311. For example, when viewed from above the front plate 102, the first side 311 may form a first circle, and the second surface 312 may have a center overlapping with the center of the first circle and form a second circle having a larger diameter than that of the first circle.

The transparent body 310 may include, for example, a side surface 313 connecting the first surface 311 and the second surface 312. In one embodiment, the light shielding film 320 may be disposed on the side surface 313 of the transparent body 310. The light shielding film 320 may prevent light from passing through the side surface 313 of the transparent body 310. For example, the light shielding film 320 may be made of a material of a black color or blackish color, which has a relatively low light transmittance. The light shielding film 320 may be formed in various thicknesses depending on the material. For example, the light shielding film 320 may be made of a first material with a first thickness capable of blocking light, or may be made of a second material having a lower light transmittance than the first material with a second thickness less than the first thickness to block light. In one embodiment, the light shielding film 320 may be formed by coating or printing a light shielding material on the side surface 313. The light shielding film 320 may be formed through various other methods (e.g., deposition).

In one embodiment, a light shielding layer 390 may be disposed on the rear surface 102b of the front plate 102 facing the display 101. When viewed from above the front plate 102, the light shielding layer 390 is in the form of a circular band surrounding the first surface 311 of the transparent body 310 and may include a circular opening 391 (see FIG. 4). The light shielding layer 390 may be made of a material of a black color or blackish color, which has a relatively low light transmittance. The light shielding layer 390 may be formed in various thicknesses capable of blocking light according to the light transmittance of the material. In one embodiment, the light shielding layer 390 may be formed by coating or printing a light shielding material on the rear surface 102b of the front plate 102. The light shielding layer 390 may be formed through various other methods (e.g., deposition).

In one embodiment, when viewed from above the front plate 102, the light shielding layer 390 may include a first circular band portion (not shown) partially overlapping the opening 1011 of the display 101 around the first surface 311 of the transparent body 310. When viewed from above the front plate 102, the light shielding layer 390 may include a second circular band portion (not shown) extending from the first circular band portion and overlapping the optical layer 331 or the light emitting layer 330. When viewed from above the front plate 102, the light shielding layer 390 may form a camera hole in the form of a circular band (see FIG. 4).

In various embodiments, when bonding the display 101 and the front plate 102, to minimize generation of bubbles due to the height difference between the rear surface 102b of the front plate 102 and the light shielding layer 390, the optically transparent adhesive member 340 may be a liquid adhesive such as optically clear resin (OCR) or super view resin (SVR).

In one embodiment, the aperture structure 301 may be bonded to the front plate 102 through the optically transparent adhesive member 302. With reference to FIGS. 3A and 4, in one embodiment, when viewed from above the front plate 102, the first surface 311 of the transparent body 310 may face the front plate 102 through the circular opening 391 of the light shielding layer 390. When viewed from above the front plate 102, the whole of the first surface 311 of the transparent body 310 may overlap the circular opening 391 of the light shielding layer 390. For example, assuming that the circular opening 391 of the light shielding layer 390 has the same diameter as the first surface 311 of the transparent body 310, it may be difficult to accurately align the whole of the first surface 311 with the circular opening 391. In one embodiment, when viewed from above the front plate 102, the circular opening 391 of the light shielding layer 390 may have a diameter 3901 greater than that of the first surface 311 of the transparent body 310 taking into account a tolerance in alignment. Due to this, the circular opening 391 of the light shielding layer 390 may be formed with the smallest diameter 3901 in consideration of the tolerance, facilitating the overlap with the whole of the first surface 311 of the transparent body 310. In various embodiments, if a bonding equipment (not shown) can align the first surface 311 of the transparent body 310 and the circular opening 391 of the light shielding layer 390 without an error, the circular opening 391 of the light shielding layer 390 may have the same diameter as that of the first surface 311 of the transparent body 310.

In one embodiment, the optically transparent adhesive member 302 may include various adhesive materials such as OCA, OCR, or SVR. In one embodiment, the transparent body 310 and the front plate 102 may be combined without an air gap through the optically transparent adhesive member 302. The optically transparent adhesive member 302 may enable securing of the quality of image data output from the image sensor 380. For example, assuming that there is an air gap between the transparent body 310 and the front plate 102, due to the differences in refractive index between different media (e.g., transparent body 310, air gap, and front plate 102), some of external light may be reflected and lost without traveling straight to the transparent body 310. The loss of light due to the air gap may cause quality degradation of image data generated by the image sensor 380. When the air gap between the transparent body 310 and the front plate 102 is filled with the optically transparent adhesive member 302, the difference in refractive index between the optically transparent adhesive member 302 and the medium layer in contact therewith can be minimized. When the difference in refractive index between the optically transparent adhesive member 302 and the medium layer in contact therewith is minimized, the reflectivity of the interface between the optically transparent adhesive member 302 and the medium layer in contact therewith may be lowered. When the reflectivity of the interface between the optically transparent adhesive member 302 and the medium layer in contact therewith decreases, as reflection at the interface and loss of light due to this can be reduced, the light reception and detection performance of the image sensor 380 for external light can be secured. In various embodiments, considering that it is possible to secure the quality of image data output from the image sensor 380 when the reflectivity of the interface between the front plate 102 and the optically transparent adhesive member 302 is low and/or the reflectivity of the interface between the optically transparent adhesive member 302 and the transparent body 310 is low, the media constituting the front plate 102, the optically transparent adhesive member 302, and the transparent body 310 may be implemented respectively with various materials.

In one embodiment, when bonding the aperture structure 301 and the front plate 102, to minimize generation of bubbles due to the height difference between the rear surface 102b of the front plate 102 and the light shielding layer 390, the optically transparent adhesive member 340 may be a liquid adhesive such as OCR or SVR.

In one embodiment, the optically transparent adhesive member 302 may be filled in the circular opening 391 of the light shielding layer 390 between the front plate 102 and the aperture structure 301. In various embodiments (not shown), the optically transparent adhesive member 302 may be expanded to further cover a portion of the light shielding layer 390. In various embodiments, a portion of the optically transparent adhesive member 302 may be flowed to cover some of the light shielding layer 390 when the aperture structure 301 is pressed toward the front plate 102.

In various embodiments, the opening 1011 of the display 101 may have a width W1 taking into account a tolerance when bonding the aperture structure 301 and the front plate 102. For example, the inner side surface 1012 of the opening 1011 may be disposed to be spaced apart from the light shielding film 320 of the aperture structure 301. When a bonding equipment (not shown) capable of minimizing the tolerance is utilized to bond the aperture structure 301 and the front plate 102, the width W1 of the opening 1011 included in the display 101 and the diameter 3901 of the opening 391 (see FIG. 4) included in the light shielding layer 390 can also be minimized.

In one embodiment, the plural pixels 330a of the light emitting layer 330 may be disposed around the light shielding layer 390 when viewed from above the front plate 102.

In one embodiment, the light shielding film 320 may prevent external light from entering the image sensor 380 of the camera device 105 through the side surface 313 of the light shielding film 320. The side surface 313 of the transparent body 310 on which the light shielding film 320 is disposed may be formed as an inclined surface that makes an obtuse angle with the first surface 311, so that external light incident at various angles can be more effectively shielded. For example, external light ① may pass between the light shielding layer 390 and the light shielding film 320 but may be practically unable to reach the transparent body 310 by being shielded or absorbed by the light shielding film 320. For example, external light ② passing through the optically transparent adhesive member 340 or through both the optically transparent adhesive member 340 and the display 101, around the light shielding layer 390, may be practically unable to reach the transparent body 310 by being shielded or absorbed by the light shielding film 320. In one embodiment, external light may be substantially guided by the aperture structure 301 to reach the camera device 105. For example, external light may substantially pass through the transparent body 310 to reach the camera device 105. For example, external light may substantially pass through the first surface 311 and the second surface 312 of the transparent body 310 to reach the camera device 105. In one embodiment, the first surface 311 of the transparent body 310 may serve as an aperture that determines the amount of light passing through the plural lenses 351, 352 and 353 by means of the light shielding film 320 surrounding the edge (not shown) of the first surface 311. In one embodiment, the first surface 311 of the transparent body 310 may be formed to have a diameter taking into account the tolerance when the camera device 105 and the aperture structure 301 are aligned.

In one embodiment, the reflectivity of the interface (not shown) between the transparent body 310 and the light shielding film 320 may be based on, for example, a first refractive index of a first medium constituting the transparent body 310 and a second refractive index of a second medium constituting the light shielding film 320. As the difference between the first refractive index and the second refractive index increases, the reflectivity of the interface between the first medium and the second medium may increase. As the reflectivity of the interface between the transparent body 310 and the light shielding film 320 becomes high, it becomes highly probable that external light passing through the first surface 311 is reflected at the interface and reaches the image sensor 380 of the camera device 105 through the second surface 312. Reflection light that is reflected at the interface between the transparent body 310 and the light shielding film 320 and enters the image sensor 380 may act as a noise component and degrade the quality of image data generated by the image sensor 380. In one embodiment, considering that it is possible to secure the quality of image data output from the image sensor 380 when the reflectivity of the interface between the transparent body 310 and the light shielding film 320 is low, the first medium constituting the transparent body 310 and the second medium constituting the light shielding film 320 may be implemented respectively with various materials.

In various embodiments, light ③ output from the light emitting layer 330 of the display 101 may be practically unable to reach the transparent body 310 by being shielded or absorbed by the light shielding film 320. Thereby, the quality of image data output from the image sensor 380 can be secured.

In various embodiments (not shown), a light shielding material may be further applied to the side surface (e.g., surface including the inner side surface 1012) of the recess 333. The light shielding material may prevent external light ② and light ③ output from the display 101 from entering the space of the recess 333. For example, when the light shielding material is to be applied to the side surface of the recess 333, the width W1 of the opening 1011 included in the display 101 may be further expanded in consideration of a tolerance allowed when bonding the aperture structure 301 and the front plate 102. In various embodiments, after bonding the aperture structure 301 and the front plate 102 by use of the optically transparent adhesive member 302, the light shielding material may be applied to the side surface of the recess 333.

In various embodiments (not shown), the aperture structure 301 may be implemented in a form including only the transparent body 310 without the light shielding film 320. In this case, after bonding the transparent body 310 and the front plate 102 through the optically transparent adhesive member 302, a light shielding material may be filled between the side surface 313 of the transparent body 310 and the side surface of the recess 333. This light shielding material may serve as the light shielding film 320. The light shielding material may prevent external light from reaching the camera device 105 through the space between the side surface of the recess 333 and the transparent body 310.

In various embodiments, there may be a gap G between the fourth surface 101b (e.g., a rear surface) of the display 101 and the second surface 312 of the transparent body 310. The gap G may refer to a gap between the back plate 332 of the display 101 and the light shielding film 320 of the aperture structure 301. In one embodiment, to prevent light from practically passing through the gap G, the shape of the light shielding layer 390 (e.g., the diameter 3901 of the circular opening 391 and/or the width W2 of the light shielding layer 390 in FIG. 4) may be determined. In one embodiment, various design conditions such as the shape of the light-shielding layer 390 or the slope of the light-shielding film 320 relative to the light-shielding layer 390 may be prepared so that light cannot practically pass through the gap G. In various embodiments, various types of light shielding members may be added to block the gap G or prevent light from reaching the plural lenses 351, 352 and 353 of the camera device 105 through the gap G. For example, with reference to FIG. 3B, after the aperture structure 301 is bonded to the front plate 102 through the optically transparent adhesive member 302, a light shielding material 3200 may be filled between the aperture structure 301 and the side surface of the recess 333. The light shielding material 3200 may prevent external light from passing through from the gap G1 between the light shielding layer 390 and the light shielding film 320 to the gap G between the rear surface 101b of the display 101 and the second surface 312 of the transparent body 310. The light shielding material 3200 may prevent external light from being reflected from the side surface (e.g., inner side surface 1012) of the recess 333 after passing through the gap G1 between the light shielding layer 390 and the light shielding film 320, or may prevent external light from directly passing through the gap G between the rear surface 101b of the display 101 and the second surface 312 of the transparent body 310. In a certain embodiment, the light shielding film 320 may be omitted, and the light shielding material 3200 may be filled between the transparent body 310 and the side surface of the recess 333. As another example, after the aperture structure 301 is bonded to the front plate 102 through the optically transparent adhesive member 302, a light shielding film (e.g., circular band-shaped shielding film) blocking the gap G may be attached to the structure composed of the front plate 102, the display 101, and the optically transparent adhesive member 340. As another example, by use of a light shielding portion that is extended from a support member (e.g., third support member 354) of the light shielding material included in the camera device 105 or is additionally attached to the camera device 105, it is possible to prevent light from reaching the plural lenses 351, 352 and 353 of the camera device 105 through the gap G. Various other shielding structures may be provided to prevent light from passing through the gap G.

In one embodiment, the camera device 105 can be arranged in alignment with the recess 333 (or, the opening 1011 of the display 101) when viewed from above the front plate 102. The camera device 105 may include, for example, a substrate 370, an image sensor 380, and a lens assembly 350.

The substrate 370 may include, for example, a fifth surface 370a facing the second surface 312 of the transparent body 310 (or, front plate 102), and a sixth surface 370b disposed on the opposite side of the fifth surface 370a and facing the rear plate 111. The image sensor 380 (e.g., charge coupled device (CCD) image sensor) may be disposed on the fifth surface 370a. When viewed from above the front plate 102, the image sensor 380 may include a light-receiving region 381 that faces the transparent body 310 and at least partially overlaps the first surface 311 or the second surface 312 of the transparent body 310. The image sensor 380 may detect light passing through the transparent body 310 to generate an electrical signal by using the light-receiving region 381. The image sensor 380 may transmit an electrical signal related to an image to the processor (e.g., graphics processing unit or image signal processor) through an electrical path (not shown) such as a flexible printed circuit (FPBC) that electrically connects the substrate 370 and the printed circuit board 240 in FIG. 2.

The lens assembly 350 may include, for example, a plurality of lenses 351, 352 and 353 and a third support member (or, housing) 354. In one embodiment, the third support member 354 may include a front opening (not shown) open toward the front plate 102, a rear opening (not shown) open toward the rear plate 111, and a wall (not shown) extending from the front opening to the rear opening. The rear opening may be coupled to the substrate 370, and the plural lenses 351, 352 and 353 may be spaced apart from the image sensor 380 and disposed in the front opening. When viewed from above the front plate 102, the light-receiving region 381 of the image sensor 380 may overlap and be aligned with the plural lenses 351, 352 and 353. The third support member 354 may include a light shielding material, and light may substantially pass through the plural lenses 351, 352 and 353 disposed in the front opening to reach the image sensor 380.

The plural lenses 351, 352 and 353 may collect or radiate light reflected from, for example, an external object (or, subject) so that an optical image is formed on the light-receiving region 381 of the image sensor 380. In various embodiments, the number or size of the lenses may be varied without being limited to the example shown in FIG. 3A. The light-receiving region 381 may indicate a point or focal plane at which light reflected from an external object passes through the plural lenses 351, 353 and 353 to form a focus.

In one embodiment, the camera device 105 may have an autofocus (AF) function. The AF function can enable shooting with precise focus. The AF function may enable shooting with an out-of-focus effect. The camera device 105 may include an AF actuator (not shown), and may automatically focus by adjusting the position of the lens. The camera device 105 may optimally find the focal length (e.g., distance between the plural lenses 351, 352 and 353 and the focal plane) according to the distance to the target object through the AF actuator. The angle of view may vary depending on the focal length. The AF actuator may apply a current to, for example, a coil to adjust the position of the lens through an electromagnetic force between the coil and a magnet. In one embodiment, the AF actuator may be implemented with an encoder scheme or a piezo scheme. In the encoder or piezo scheme, the position of the lens can be controlled after determining the position of the lens through a position sensor. In another embodiment, the AF actuator may be implemented based on a voice coil motor scheme. The voice coil motor scheme may control the position of the lens by using a current applied to the coil.

In various embodiments, an additional aperture may be disposed between the lenses 351, 352 and 353, or between the lenses 351, 352 and 353 and the image sensor 380.

In various embodiments, the camera device 105 may not support an AF function. The angle of view of the camera device 105 is set to a wide angle, and the camera device 105 may take pictures with infinity focus without an AF function. In various embodiments, for the video call mode or the selfie shot mode, the camera device 105 may be set to a viewing angle or a focal length suitable for the face of the user holding the electronic device 100 with one hand.

In one embodiment, there may be an air gap (not shown) between the second surface 312 of the aperture structure 301 and the plural lenses 351, 352 and 353 of the camera device 105. Light may pass through the air gap when traveling from the transparent body 310 to the lens 351. Due to the difference in refractive index between the air gap and the transparent body 310, there may be loss of light due to reflection at the interface between the air gap and the transparent body 310. Due to the difference in refractive index between the air gap and the lens 351, there may be loss of light due to reflection at the interface between the air gap and the lens 351. In various embodiments (not shown), an anti-reflection layer may be disposed between the second surface 312 of the aperture structure 301 and the lens 351 of the camera device 105. The anti-reflection layer can improve transmittance by suppressing reflection of light. In one embodiment, the anti-reflection layer may be disposed on the second surface 312 of the transparent body 310. As the anti-reflection layer can reduce light loss, the light reception and detection performance of the image sensor 380 for external light can be secured.

In one embodiment, the second surface 312 of the transparent body 310 may not protrude relative to the fourth surface 101b of the display 101. In various embodiments (not shown), to reduce the gap between the lens 351 of the camera device 105 and the second surface 312, the second surface 312 of the transparent body 310 may protrude relative to the fourth surface 101b of the display 101.

In one embodiment, the scheme for preparing the aperture structure 301 separately from the camera device 105 including the plural lenses 351, 352 and 353 and the image sensor 380 and attaching the aperture structure 301 to the front plate 102 through the opening 1011 of the display 101 may contribute to minimizing the size of the opening of the display and the camera hole and to maximizing the screen accordingly while securing the light reception and detection performance of the camera device 105. In addition, the above method may contribute to slimming of the electronic device 100. Assuming that there is a camera device having a body tube structure in which a lens, an image sensor, and an aperture are arranged so that the lens is disposed between the image sensor and the aperture, the opening of the display and the camera hole in consideration of the body tube structure and the tolerance needed during its manufacture may be formed larger than the opening 1011 of the display 101 and the camera hole (e.g., light shielding layer 390) according to an embodiment of the disclosure.

In one embodiment, the first support member 211 may include an opening 2113 formed at a position aligned with the recess 333 (or, opening 1011 of the display 101) when viewed from above the front plate 102. The camera device 105 may be disposed in the opening 2113. The opening 2113 may include, for example, a first space 2111 in which the third support member 354 is disposed, and a second space 2112 in which the substrate 370 is disposed. A mounting surface 2114 of a jaw shape may be formed due to a difference in width between the first space 2111 and the second space 2112. The second space 2112 may have a width and a depth for arranging the substrate 370 on the first support member 211 without shaking. The substrate 370 may be disposed on the mounting surface 2114 in the second space 2112, and the camera device 105 may be aligned with the aperture structure 301. In various embodiments, the second support member 260 may include a portion 261 that presses the substrate 370 toward the mounting surface 2114 when combined with the first support member 211. In various embodiments, the substrate 370 may be coupled with the mounting surface 2114 in the second space 2112 through various adhesive members such as an adhesive or a bolt.

In various embodiments (not shown), the camera device 105 may be arranged on the first support member 211 or the second support member 260 in alignment with the aperture structure 301 through various other methods. For example, the first support member may include a recess formed on a surface facing the aperture structure 301. The camera device 105 may be disposed in the recess.

In a certain embodiment (not shown), the camera device 105 may be directly connected to the aperture structure 301.

In various embodiments (not shown), at least some of the aperture structure 301 and related elements may be utilized for various other optical sensors (e.g., proximity sensor or infrared sensor) using the opening formed in the display 101. Depending on the types of optical sensors, at least one of the components of the electronic device 100 may be omitted or replaced with another component, or a different component may be additionally included. For example, when an optical sensor such as a proximity sensor or an infrared sensor is used, the plural lenses 351, 352 and 353 and/or the third support member 354 may be omitted. In various embodiments, for an optical sensor receiving light of a specified frequency band (e.g., proximity sensor that receives light with a maximum sensitivity wavelength of about 940 nm or about 950 nm), the light shielding layer 390 and/or the light shielding film 320 may be implemented to shield light of the specified frequency band.

In various embodiments, the camera device 105 may be disposed at various other positions without being limited to the embodiment of FIGS. 1A and 2.

In various embodiments, the aperture structure may be implemented in a form in which the transparent body 310 is omitted.

In various embodiments, the aperture structure may be implemented in a form in which the space between the first surface 311, the second surface 312, and the light shielding film 320 is filled with a vacuum.

In various embodiments, the opening 1011 of the display 101 may be changed to a notch shape, and this will be described with reference to FIG. 5.

Figure 5:
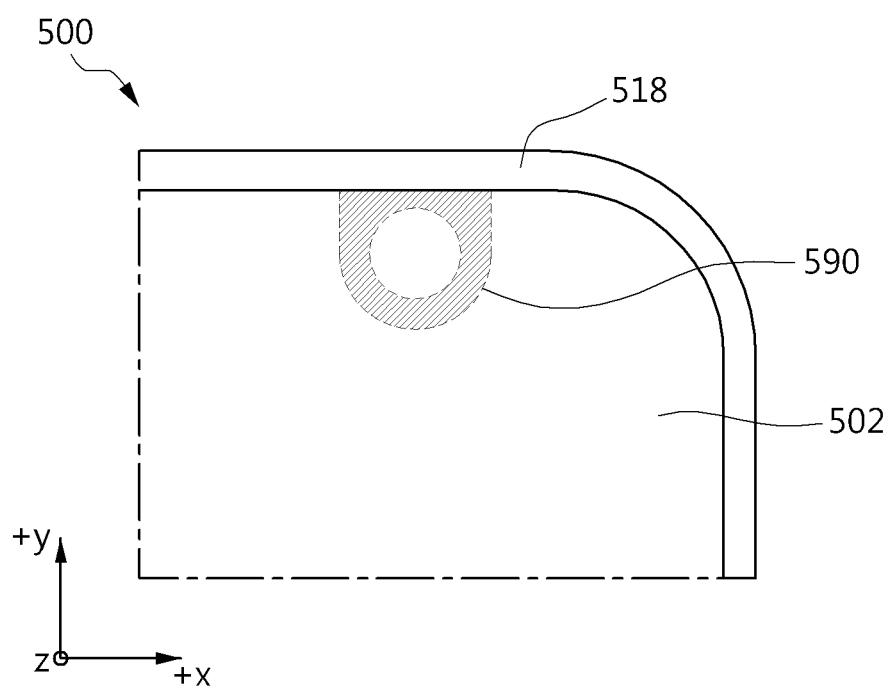
FIG. 5 is a plan view of an electronic device according to an embodiment of the disclosure.

FIG. 5 is a plan view of an electronic device according to an embodiment of the disclosure.

Referring to FIG. 5, in one embodiment, the electronic device 500 may include a front plate 502, a side member 518, or a light shielding layer 590. At least one of the components of the electronic device 500 in FIG. 5 may be identical or similar to at least one of the components of the electronic device 100 in FIG. 3A or 4. For example, the front plate 502 may be identical to the front plate 102 in FIG. 3A or 4. For example, the side member 518 may be identical to the side member 118 in FIG. 3A or 4.

In one embodiment, the electronic device 500 may include a camera device (e.g., camera device 105 in FIG. 3A) and an aperture structure (e.g., aperture structure 301 in FIG. 3A) disposed between the front plate 502 and the camera device. The aperture structure may be bonded to the front plate 502 through an optically transparent adhesive member (e.g., optically transparent adhesive member 302 in FIG. 3A). In one embodiment, the electronic device 500 may include a display (not shown) having a notch (not shown) formed near the side member 518. When viewed from above the front plate 502, the notch may be in the shape of a cut in a direction from one edge of the display toward the other edge on the opposite side (e.g., negative y-axis direction). In one embodiment, similarly to the case where the light shielding layer 390 is arranged in correspondence with the opening 1011 of the display 101 and the aperture structure 301 in FIG. 3A, the light shielding layer 590 may be arranged in correspondence with the notch of the display and the aperture structure as shown FIG. 5.

In one embodiment, similarly to the embodiment of FIG. 3A or 4, the embodiment of FIG. 5 may contribute to minimizing the size of the notch of the display and the camera hole and to maximizing the screen accordingly while securing the light reception and detection performance of the camera device.

Figure 6:
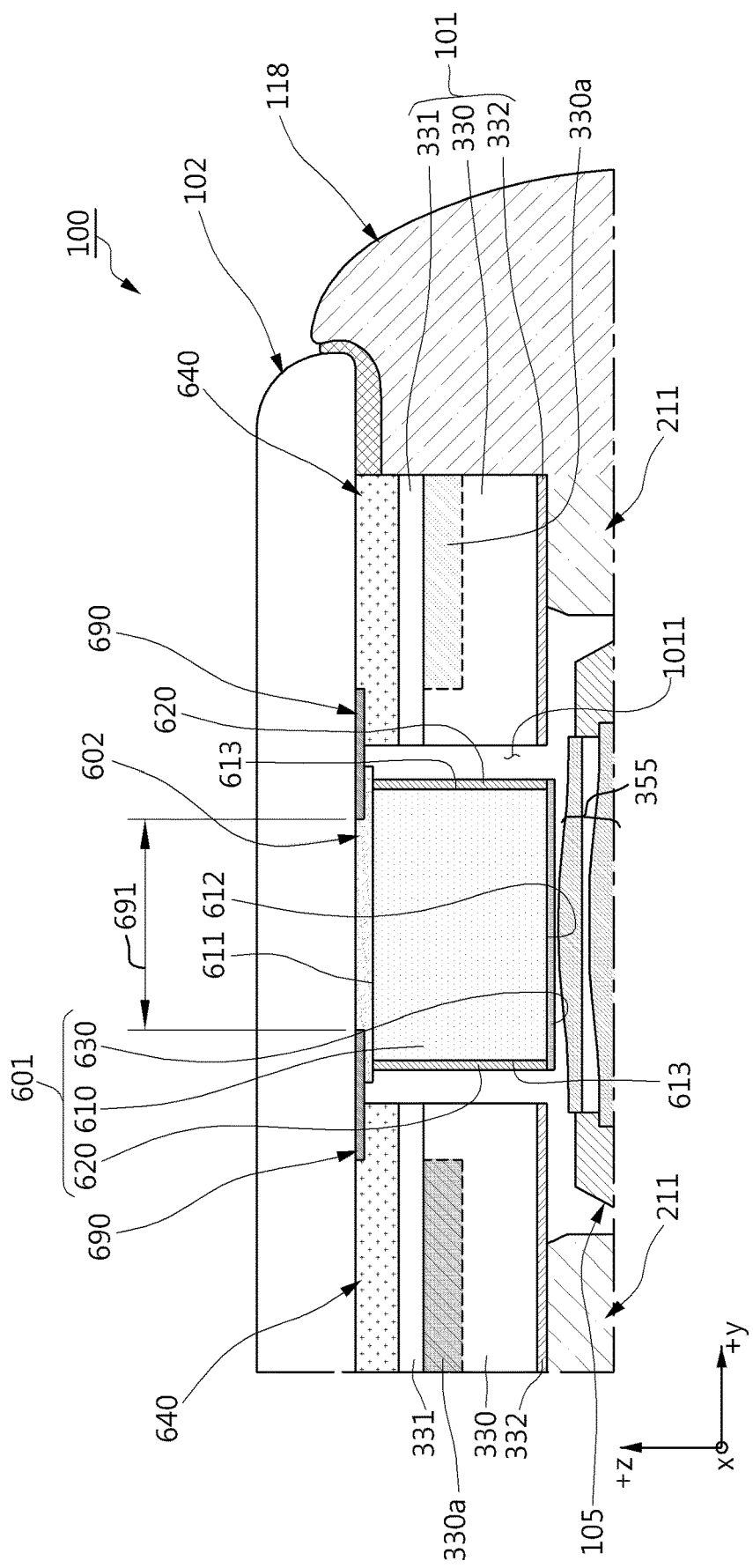
FIG. 6 is a cross-sectional view of the electronic device of FIG. 1A along the line A-A' according to an embodiment of the disclosure.

FIG. 6 is a cross-sectional view of the electronic device 100 of FIG. 1A along the line A-A' according to an embodiment of the disclosure.

Referring to FIG. 6, in one embodiment, the electronic device 100 may include a front plate 102, a side member 118, a first support member 211, a display 101, a light path structure 601, an optically transparent adhesive member 640, an optically transparent adhesive member 602, a light shielding layer 690, and a camera device 105. At least one of the components of the electronic device 100 shown in FIG. 6 may be identical or similar to at least one of the components shown in FIG. 3A, and a repeated description may be omitted. For example, the display 101 including the optical layer 331, the light emitting layer 330 and the back plate 332 may include an opening 1011, and may be bonded to the front plate 102 through the optically transparent adhesive member 640 (e.g., optically transparent adhesive member 340 in FIG. 3A).

In one embodiment, the light path structure 601 may be bonded to the front plate 102 through the optically transparent adhesive member 602 (e.g., optically transparent adhesive member 302 in FIG. 3A) in the opening 1011 of the display 101. The light path structure 601 may be disposed between the front plate 102 and at least one lens 355 (e.g., plural lenses 351, 352 and 353 in FIG. 3A) of the camera device 105. The light path structure 601 may include a transparent body 610, a light shielding film 620, or an anti-reflection layer 630.

In one embodiment, the transparent body 610 may include a first surface 611 facing the front plate 102, and a second surface 612 disposed on the opposite side of the first surface 611 and facing the at least one lens 355 of the camera device 105. The transparent body 610 may include a side surface 613 connecting the first surface 611 and the second surface 612. The side surface 613 may be perpendicular to the first surface 611 or the second surface 612. For example, the transparent body 610 may be a cylinder in which the first surface 611 and the second surface 612 are congruent parallel circles. The transparent body 610 has a different shape from, for example, the transparent body 310 in FIG. 3A but may play substantially the same role.

In one embodiment, the light shielding film 620 may be disposed on the side surface 613 of the transparent body 610. The light shielding film 620 may play substantially the same role as, for example, the light shielding film 320 in FIG. 3A.

In one embodiment, the anti-reflection layer 630 may be disposed between the transparent body 610 and the at least one lens 355. The anti-reflection layer 630 may be disposed on, for example, the second surface 612 of the transparent body 610. In various embodiments, the anti-reflection layer 630 may be connected to the light shielding film 620. External light incident on the first surface 611 of the transparent body 610 may pass through the anti-reflection layer 630 disposed on the second surface 612 of the transparent body 610 and reach the at least one lens 355 of the camera device 105. The anti-reflection layer 630 may improve transmittance by suppressing reflection of light. As the anti-reflection layer 630 can reduce light loss, the light reception and detection performance of the image sensor 380 in FIG. 3A for external light may be secured.

In one embodiment, when viewed from above the front plate 102, the light shielding layer 690 (e.g., light shielding layer 390 in FIG. 3A) may include a first circular band portion (not shown) overlapping some of the first surface 611 of the transparent body 610, and a second circular band portion (not shown) extending from the first circular band portion and overlapping the optical layer 331 or the light emitting layer 330. When viewed from above the front plate 102, the light shielding layer 690, like the light shielding layer 390 in FIG. 4, may form a camera hole in the shape of a circular band. The plural pixels 330a of the display 101 may be arranged so as not to overlap the light shielding layer 690 when viewed from above the front plate 102. In one embodiment, the light shielding layer 690 may not only serve substantially the same as the light shielding layer 390 in FIG. 3A but also serve as an aperture. For example, a circular opening 691 (e.g., circular opening 391 in FIG. 3A) formed in the light shielding layer 690 may serve as an aperture that determines the amount of light passing through the at least one lens 355 of the camera device 105.

Figure 7:
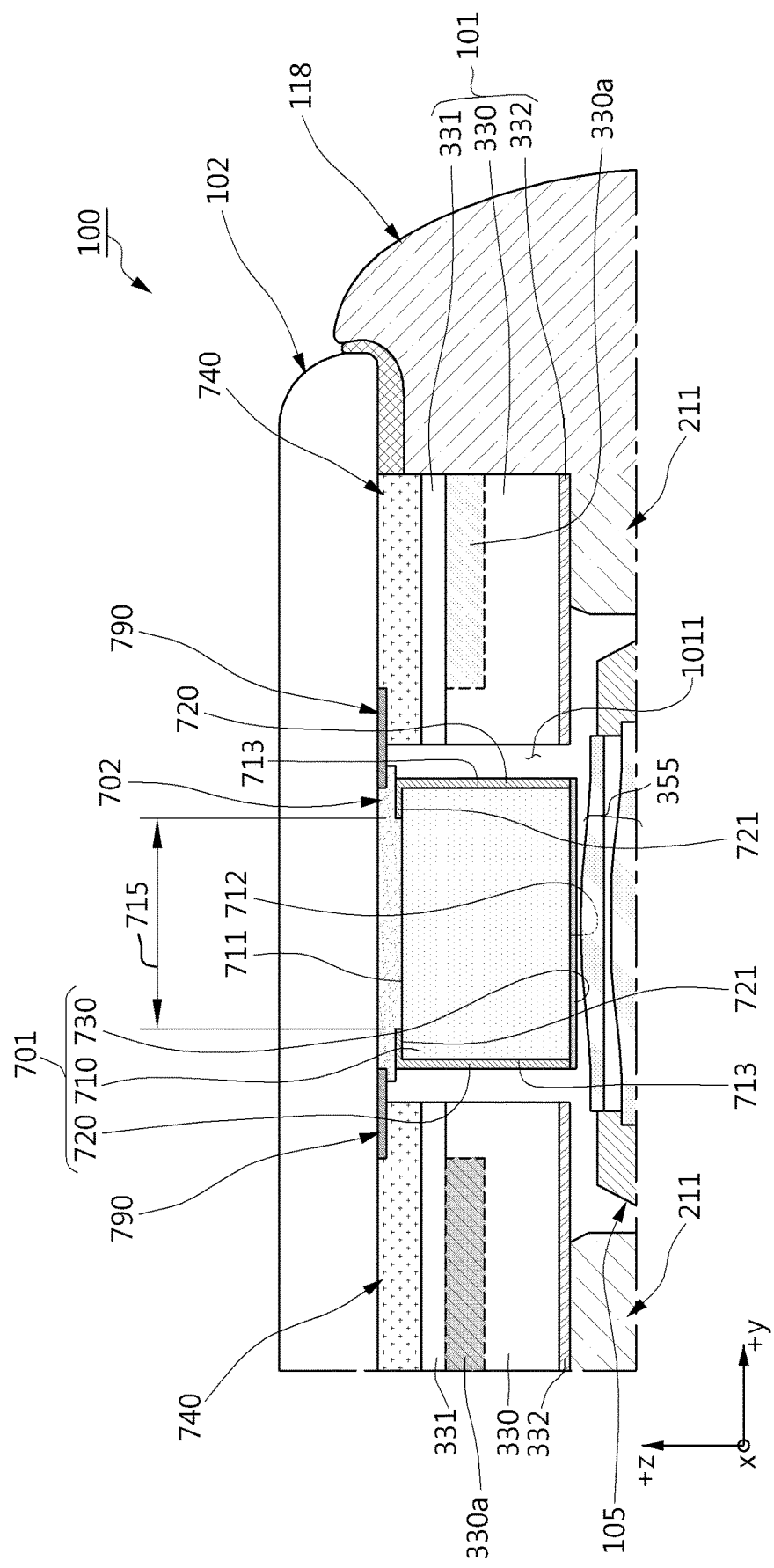
FIG. 7 is a cross-sectional view of the electronic device of FIG. 1A along the line A-A' according to an embodiment of the disclosure.

FIG. 7 is a cross-sectional view of the electronic device 100 of FIG. 1A along the line A-A' according to an embodiment of the disclosure.

Referring to FIG. 7, in one embodiment, in one embodiment, the electronic device 100 may include a front plate 102, a side member 118, a first support member 211, a display 101, an aperture structure 701, an optically transparent adhesive member 740, an optically transparent adhesive member 702, a light shielding layer 790, and a camera device 105. At least one of the components of the electronic device 100 shown in FIG. 7 may be identical or similar to at least one of the components shown in FIG. 3A or 6, and a repeated description may be omitted. For example, the display 101 including the optical layer 331, the light emitting layer 330 and the back plate 332 may include an opening 1011, and may be bonded to the front plate 102 through the optically transparent adhesive member 740 (e.g., optically transparent adhesive member 340 in FIG. 3A).

In one embodiment, the aperture structure 701 may be bonded to the front plate 102 through the optically transparent adhesive member 702 (e.g., optically transparent adhesive member 602 in FIG. 6) in the opening 1011 of the display 101. The aperture structure 701 may be disposed between the front plate 102 and the at least one lens 355 (e.g., plural lenses 351, 352 and 353 in FIG. 3A) of the camera device 105. The aperture structure 701 may include a transparent body 710, a light shielding film 720, or an anti-reflection layer 730.

In one embodiment, the transparent body 710 may include a first surface 711 facing the front plate 102, a second surface 712 disposed on the opposite side of the first surface 711 and facing the at least one lens 355 of the camera device 105, and a side surface 713 connecting the first surface 711 and the second surface 712. The transparent body 710 may be substantially the same as, for example, the transparent body 610 in FIG. 6. The transparent body 710 has a different shape from the transparent body 310 in FIG. 3A but may play substantially the same role.

In one embodiment, the light shielding layer 720 may cover both the side surface 713 of the transparent body 710 and some of the first surface 711 of the transparent body 710. For example, when viewed from above the front plate 102, the light shielding film 720 may include a circular band portion 721 disposed along the edge (not shown) of the first surface 711 of the transparent body 710 to cover some of the first surface 711. The light shielding film 720 may play substantially the same role as, for example, the light shielding film 320 in FIG. 3A. In one embodiment, the circular band portion 721 of the light shielding film 720 may serve as an aperture that determines the amount of light passing through the at least one lens 355 of the camera device 105. For example, when viewed from above the front plate 102, external light may travel to the transparent body 710 through a region 715 of the first surface 711 not covered by the circular band portion 721 of the light shielding film 720.

In various embodiments (not shown), when viewed from above the front plate 102, the circular band portion 721 may be disposed on the second surface 712.

In one embodiment, the anti-reflection layer 730 may be disposed on the second surface 712 of the transparent body 710, and may be substantially the same as the anti-reflection layer 630 in FIG. 6.

In one embodiment, when viewed from above the front plate 102, the light shielding layer 790 (e.g., light shielding layer 390 in FIG. 3A) may be disposed so as not to overlap the region 715 of the first surface 711 of the transparent body 710. When viewed from above the front plate 102, the light shielding layer 790, like the light shielding layer 390 in FIG. 4, may form a camera hole in the shape of a circular band. The plural pixels 330a of the display 101 may be arranged so as not to overlap the light shielding layer 390 when viewed from above the front plate 102.

FIGS. 8A, 8B, 8C, 8D and 8E are cross-sectional views of the aperture structure 301 of FIG. 3A during a manufacturing process according to various embodiments of the disclosure.

Figure 8A:
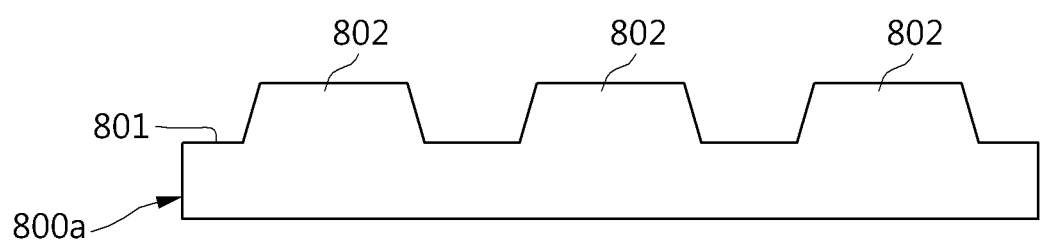
FIGS. 8A, 8B, 8C, 8D and 8E are cross-sectional views of an aperture structure of FIG. 3A during a manufacturing process according to various embodiments of the disclosure.

Referring to FIG. 8A, a first structure 800a of a plate shape made of the same material as that of the transparent body 310 in FIG. 3A may be prepared through various molding methods such as injection molding. In one embodiment, the first structure 800a may include a surface 801 including a plurality of protrusions 802. For example, the plural protrusions 802 may be a tapered cylinder and may have a trapezoidal shape when viewed in cross section. In various embodiments, when molding a cylindrical transparent body such as the transparent body 610 in FIG. 6 or the transparent body 710 in FIG. 7, the plural protrusions 802 may have a rectangular shape when viewed in cross section.

Figure 8B:
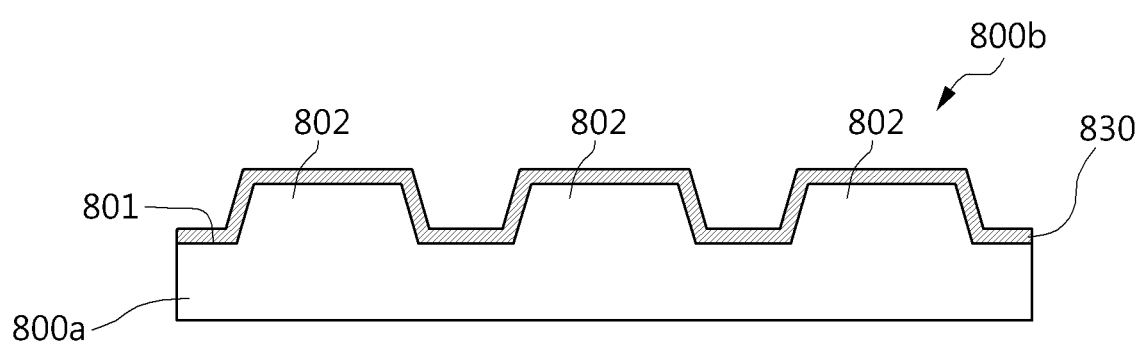

Referring to FIGS. 8A and 8B, the second structure 800b may be formed by coating or printing the same material 830 as that of the light shielding film 320 in FIG. 3A on the surface 801 of the first structure 800a including the plural protrusions 802.

Figure 8C:
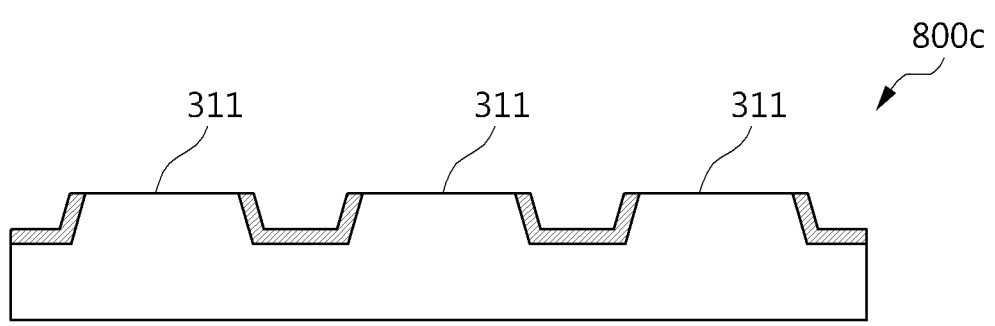

Referring to FIGS. 8B and 8C, a third structure 800c including the first surface 311 may be formed through various cutting methods such as polishing.

Figure 8D:
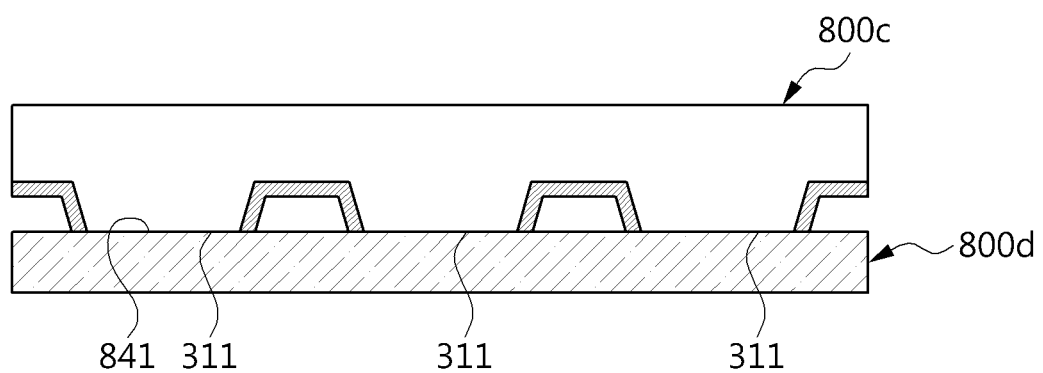

Referring to FIGS. 8C and 8D, the first surface 311 of the third structure 800c may be attached so as to face a support plate 800d. One surface 841 of the support plate 800d facing the first surface 311 may be an adhesive surface including an adhesive material (referred to as "adhesive surface"). The first surface 311 may be detachably coupled to the adhesive surface 841.

Figure 8E:
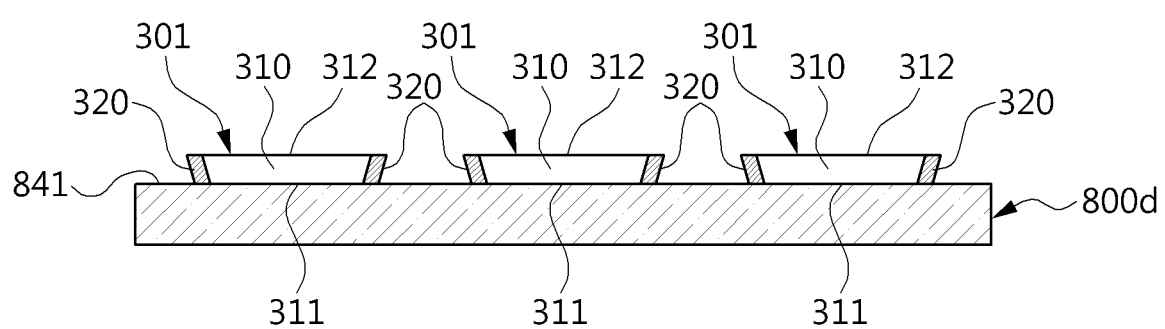

Referring to FIGS. 8D and 8E, the second surface 312 may be formed through various cutting methods such as polishing. The transparent body 310 having the first surface 311 and the second surface 312, and aperture structures 301 including the light shielding film 320 disposed on the side surface (e.g., side surface 313 in FIG. 3A) connecting the first side 311 and the second side 312 of the transparent body 310 may be disposed on the adhesive surface 841 of the support plate 800d.

Referring to FIGS. 3A and 8E, the transparent body 310 may be separated from the support plate 800d and bonded to the front plate 102 in FIG. 3A through, for example, a bonding equipment (not shown).

Figure 9:
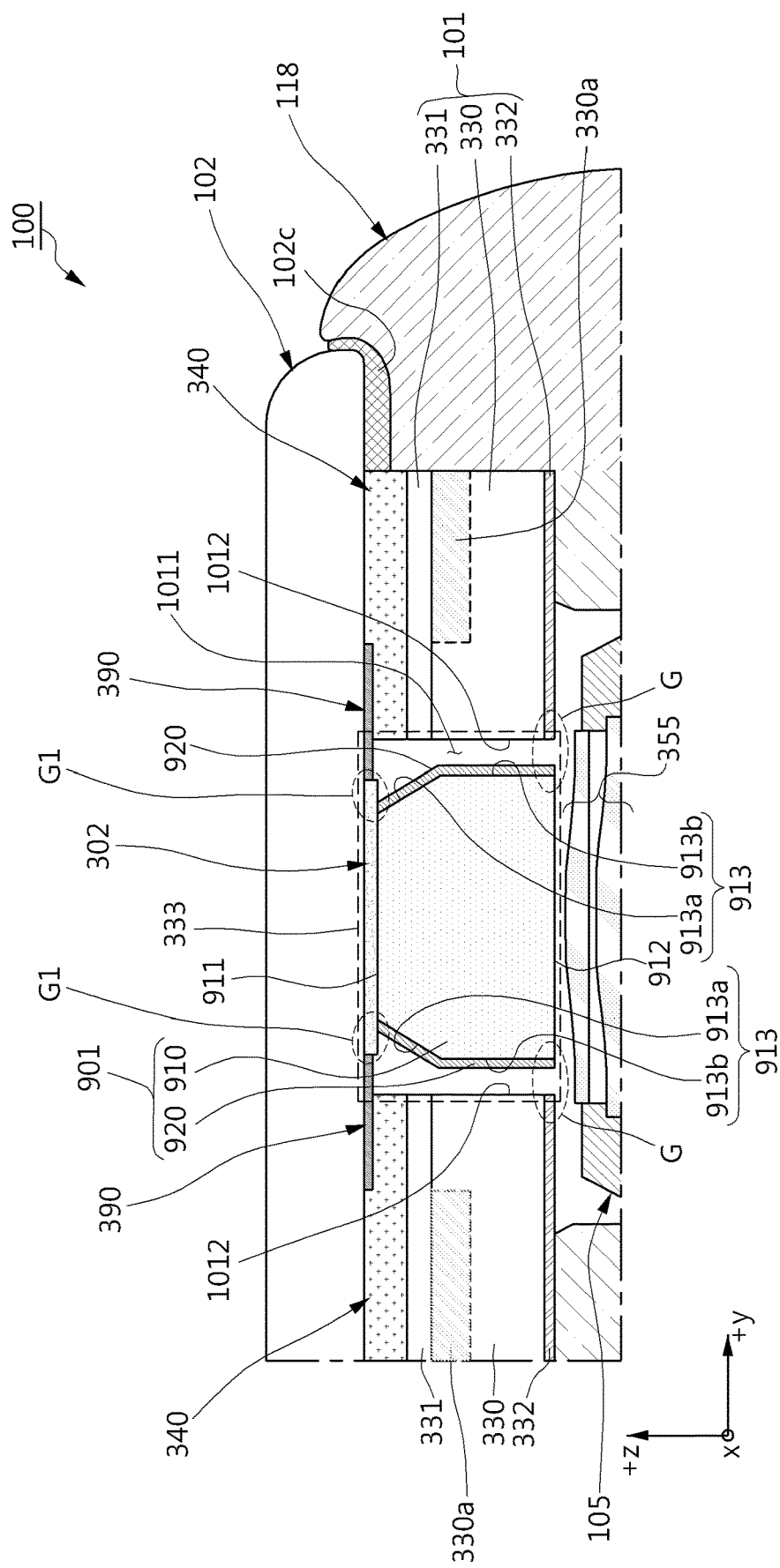
FIG. 9 is a cross-sectional view of the electronic device of FIG. 1A along the line A-A' according to an embodiment of the disclosure.

FIG. 9 is a cross-sectional view of the electronic device 100 of FIG. 1A along the line A-A' according to an embodiment of the disclosure.

Referring to FIG. 9, in one embodiment, the electronic device 100 may include a front plate 102, a side member 118, a first support member 211, a display 101, an aperture structure 901, an optically transparent adhesive member 340, an optically transparent adhesive member 302, a light shielding layer 390, and a camera device 105. At least one of the components of the electronic device 100 shown in FIG. 9 may be identical or similar to at least one of the components shown in FIG. 3A, and a repeated description may be omitted. For example, the display 101 including the optical layer 331, the light emitting layer 330 and the back plate 332 may include an opening 1011, and may be bonded to the front plate 102 through the optically transparent adhesive member 340.

In one embodiment, the aperture structure 901 may be bonded to the front plate 102 through the optically transparent adhesive member 302 in the opening 1011 of the display 101. The aperture structure 901 may be disposed between the front plate 102 and the at least one lens 355 (e.g., plural lenses 351, 352 and 353 in FIG. 3A) of the camera device 105. The aperture structure 901 may include a transparent body 910 and/or a light shielding film 920.

In one embodiment, the transparent body 910 may include a first surface 911 facing the front plate 102, a second surface 912 disposed on the opposite side of the first surface 911 and facing the at least one lens 355 of the camera device 105, and a side surface 913 connecting the first surface 911 and the second surface 912. The transparent body 910 has a different shape from, for example, the transparent body 310 in FIG. 3A but may play substantially the same role. The light shielding film 920 may be disposed on the side surface 913 of the transparent body 910, preventing light from passing through the side surface 913 of the transparent body 910. The light shielding film 920 has a different shape from the light shielding film 320 in FIG. 3A but may play substantially the same role.

In one embodiment, the side surface 913 of the transparent body 910 may include a first region 913*a* formed as an inclined surface making an obtuse angle with the first surface 911 and connected to the first surface 911, and a second region 913*b* connecting between the first region 913*a* and the second surface 912. In one embodiment, the second region 913*b* may be perpendicular to the first surface 911 or the second surface 912. The first region 913*a* and the second region 913*b* may make an obtuse angle.

In one embodiment, the structure in which the side surface 913 of the transparent body 910 includes the first region 913*a* and the second region 913*b* and the light shielding film 920 is disposed on the side surface 913 may contribute to preventing external light reaching the at least one lens 355. The above structure may limit the angle or range of incidence for external light to pass through the gap G1 between the light shielding layer 390 and the light shielding film 320, which may then reduce the possibility that external light is reflected from the side surface (e.g., inner side surface 1012) of the recess 333 and passes through the gap G between the rear surface (not shown) of the display 101 and the second surface 912 of the transparent body 910.

In various embodiments, a light shielding material (e.g., light shielding material 3200 in FIG. 3B) may be filled in the recess 333. In this case, the light shielding film 920 may be omitted.

Figure 10:
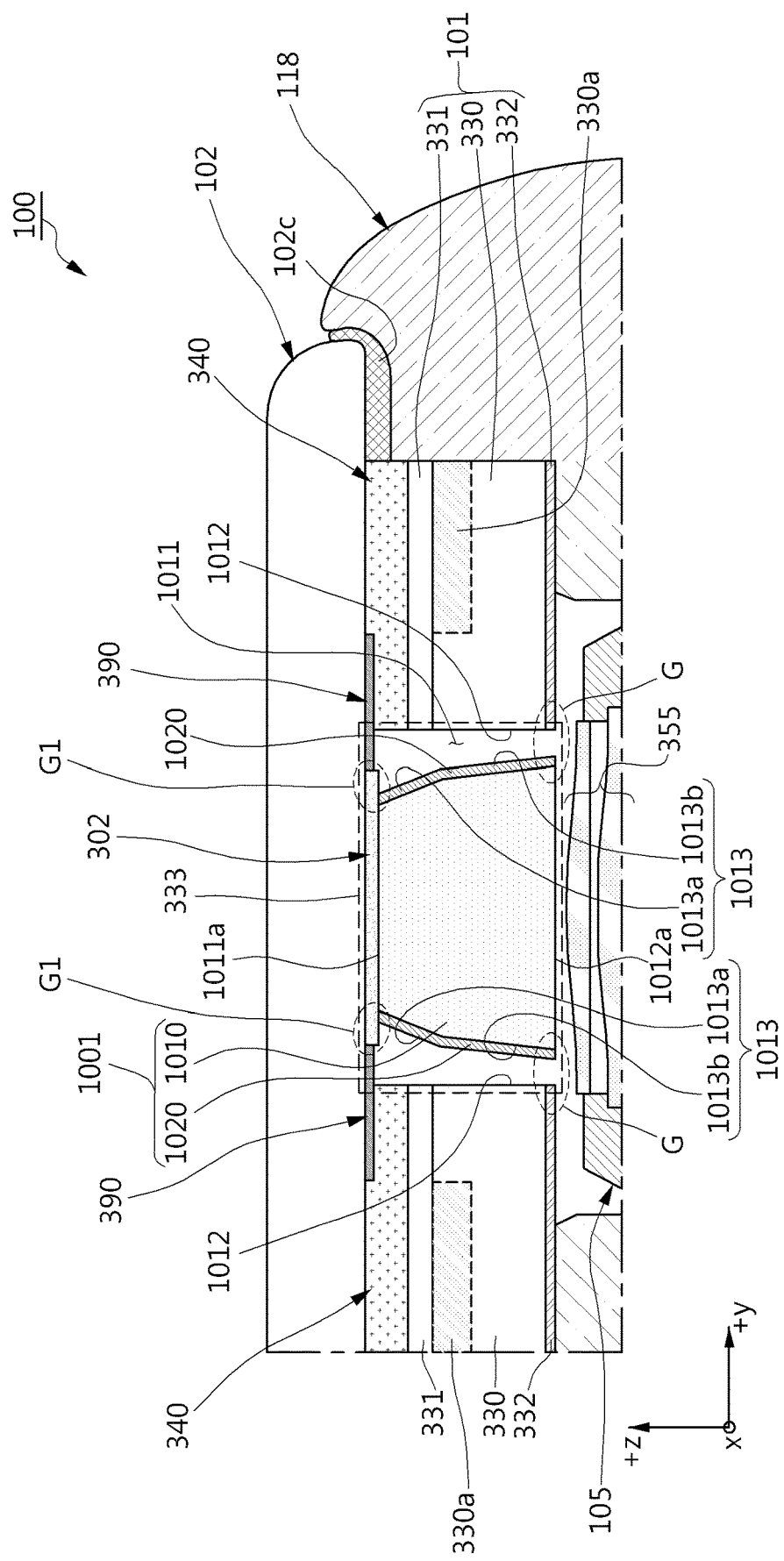
FIG. 10 is a cross-sectional view of the electronic device of FIG. 1A along the line A-A' according to an embodiment of the disclosure.

FIG. 10 is a cross-sectional view of the electronic device 100 of FIG. 1A along the line A-A' according to an embodiment of the disclosure.

Referring to FIG. 10, in one embodiment, the electronic device 100 may include a front plate 102, a side member 118, a first support member 211, a display 101, an aperture structure 1001, an optically transparent adhesive member 340, an optically transparent adhesive member 302, a light shielding layer 390, and a camera device 105. At least one of the components of the electronic device 100 shown in FIG. 10 may be identical or similar to at least one of the components shown in FIG. 3A or 9, and a repeated description may be omitted. For example, the display 101 including the optical layer 331, the light emitting layer 330 and the back plate 332 may include an opening 1011, and may be bonded to the front plate 102 through the optically transparent adhesive member 340.

In one embodiment, the aperture structure 1001 may be bonded to the front plate 102 through the optically transparent adhesive member 302 in the opening 1011 of the display 101. The aperture structure 1001 may be disposed between the front plate 102 and the at least one lens 355 (e.g., plural lenses 351, 352 and 353 in FIG. 3A) of the camera device 105. The aperture structure 1001 may include a transparent body 1010 or a light shielding film 1020.

In one embodiment, the transparent body 1010 may include a first surface 1011*a* facing the front plate 102, a second surface 1012*a* disposed on the opposite side of the first surface 1011*a* and facing the at least one lens 355 of the camera device 105, and a side surface 1013 connecting the first surface 1011*a* and the second surface 1012*a*. The transparent body 1010 has a different shape from, for example, the transparent body 910 in FIG. 9 but may play substantially the same role. The light shielding film 1020 may be disposed on the side surface 1013 of the transparent body 1010, preventing light from passing through the side surface 1013 of the transparent body 1010. The light shielding film 1020 has a different shape from the light shielding film 920 in FIG. 9 but may play substantially the same role.

In one embodiment, the side surface 1013 of the transparent body 1010 may include a first region 1013*a* formed as an inclined surface making an obtuse angle with the first surface 1011*a* and connected to the first surface 1011*a*, and a second region 1013*b* connecting between the first region 1013*a* and the second surface 1012*a* and making an acute angle with the second surface 1012*a*. The first region 1013*a* and the second region 1013*b* may make an obtuse angle.

In one embodiment, the structure in which the side surface 1013 of the transparent body 1010 includes the first region 1013*a* and the second region 1013*b* and the light shielding film 1020 is disposed on the side surface 1013 may contribute to preventing external light reaching the at least one lens 355. The above structure may limit the angle or range of incidence for external light to pass through the gap G1 between the light shielding layer 390 and the light shielding film 320, which may then reduce the possibility that external light is reflected from the side surface (e.g., inner side surface 1012) of the recess 333 and passes through the gap G between the rear surface (not shown) of the display 101 and the second surface 1012*a* of the transparent body 1010.

In various embodiments, a light shielding material (e.g., light shielding material 3200 in FIG. 3B) may be filled in the recess 333. In this case, the light shielding film 1020 may be omitted.

Figure 11:
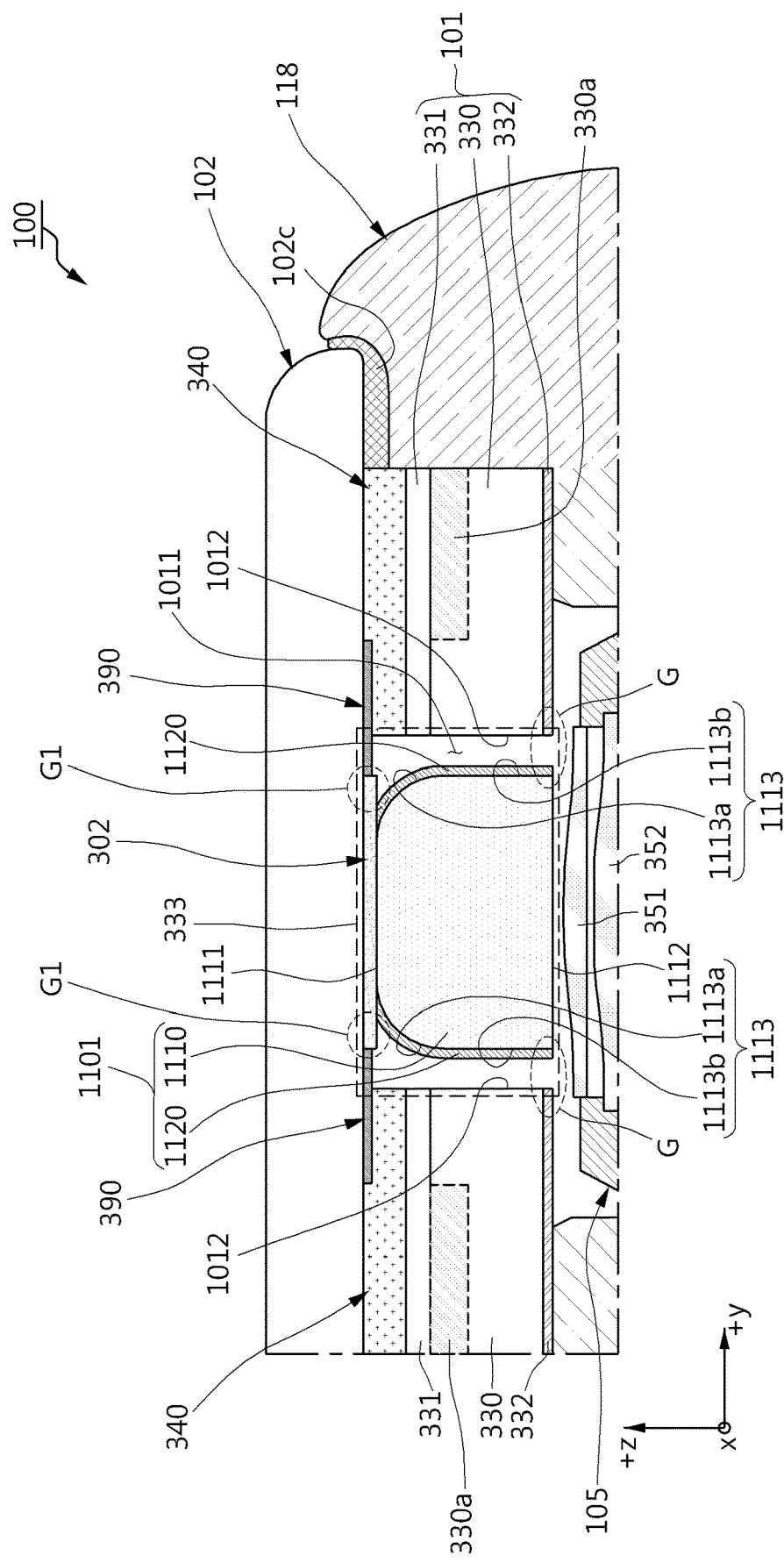
FIG. 11 is a cross-sectional view of the electronic device of FIG. 1A along the line A-A' according to an embodiment of the disclosure.

FIG. 11 is a cross-sectional view of the electronic device 100 of FIG. 1A along the line A-A' according to an embodiment of the disclosure.

Referring to FIG. 11, in one embodiment, the electronic device 100 may include a front plate 102, a side member 118, a first support member 211, a display 101, an aperture structure 1101, an optically transparent adhesive member 340, an optically transparent adhesive member 302, a light shielding layer 390, and a camera device 105. At least one of the components of the electronic device 100 shown in FIG. 11 may be identical or similar to at least one of the components shown in FIG. 3A, and a repeated description may be omitted. For example, the display 101 including the optical layer 331, the light emitting layer 330 and the back plate 332 may include an opening 1011, and may be bonded to the front plate 102 through the optically transparent adhesive member 340.

In one embodiment, the aperture structure 1101 may be bonded to the front plate 102 through the optically transparent adhesive member 302 in the opening 1011 of the display 101. The aperture structure 1101 may be disposed between the front plate 102 and the at least one lens 355

(e.g., plural lenses 351, 352 and 353 in FIG. 3A) of the camera device 105. The aperture structure 1101 may include a transparent body 1110 or a light shielding film 1120.

In one embodiment, the transparent body 1110 may include a first surface 1111 facing the front plate 102, a second surface 1112 disposed on the opposite side of the first surface 1111 and facing the at least one lens 355 of the camera device 105, and a side surface 1113 connecting the first surface 1111 and the second surface 1112. The transparent body 1110 has a different shape from, for example, the transparent body 310 in FIG. 3A but may play substantially the same role. The light shielding film 1120 may be disposed on the side surface 1113 of the transparent body 1110, preventing light from passing through the side surface 1113 of the transparent body 1110. The light shielding film 1120 has a different shape from the light shielding film 320 in FIG. 3A but may play substantially the same role.

In one embodiment, the side surface 1113 of the transparent body 1110 may include a first region 1113a in the shape of a curved surface connected to the first surface 1111, and a second region 1113b connecting between the first region 1113a and the second surface 1112 and perpendicular to the second surface 1112. The first region 1113 and the second region 1113 may be seamlessly connected. In various embodiments (not shown), the second region 1113b may be configured to make an acute angle with the second surface 1112. In various embodiments, the second region 1113b may be referred to as a side surface, and the first region 1113a may be referred to as a portion seamlessly connecting the side surface and the first surface 1111.

In one embodiment, the structure in which the side surface 1113 of the transparent body 1110 includes the first region 1113a and the second region 1113b and the light shielding film 1120 is disposed on the side surface 1113 may contribute to preventing external light reaching the at least one lens 355. The above structure may limit the angle or range of incidence for external light to pass through the gap G1 between the light shielding layer 390 and the light shielding film 320, which may then reduce the possibility that external light is reflected from the side surface (e.g., inner side surface 1012) of the recess 333 and passes through the gap G between the rear surface (not shown) of the display 101 and the second surface 1112 of the transparent body 1110.

In various embodiments, a light shielding material (e.g., light shielding material 3200 in FIG. 3B) may be filled in the recess 333. In this case, the light shielding film 1120 may be omitted.

Figure 12:
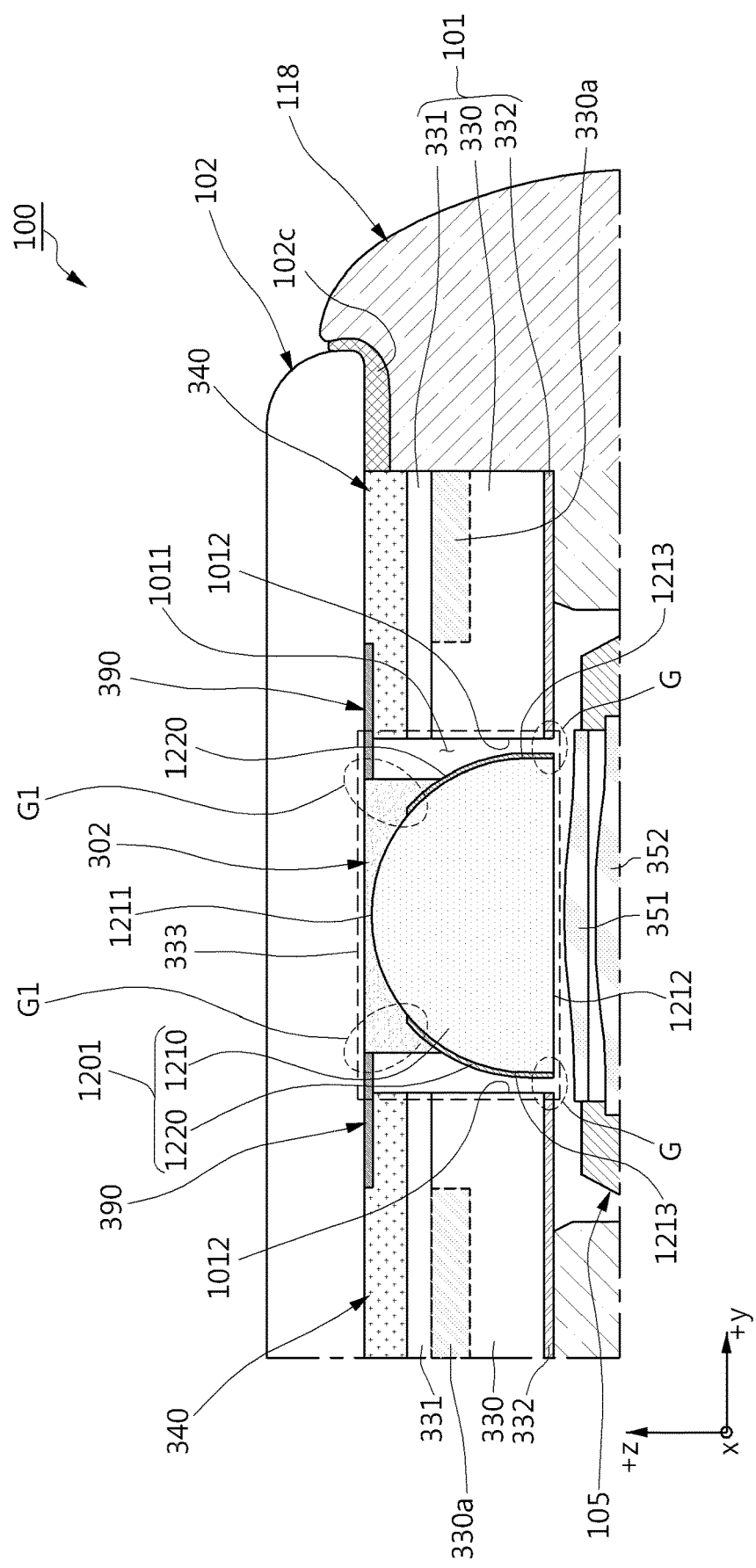
FIG. 12 is a cross-sectional view of the electronic device of FIG. 1A along the line A-A' according to an embodiment of the disclosure.

FIG. 12 is a cross-sectional view of the electronic device 100 of FIG. 1A along the line A-A' according to an embodiment of the disclosure.

Referring to FIG. 12, in one embodiment, the electronic device 100 may include a front plate 102, a side member 118, a first support member 211, a display 101, an aperture structure 1201, an optically transparent adhesive member 340, an optically transparent adhesive member 302, a light shielding layer 390, and a camera device 105. At least one of the components of the electronic device 100 shown in FIG. 12 may be identical or similar to at least one of the components shown in FIG. 3A, and a repeated description may be omitted. For example, the display 101 including the optical layer 331, the light emitting layer 330 and the back plate 332 may include an opening 1011, and may be bonded to the front plate 102 through the optically transparent adhesive member 340.

In one embodiment, the aperture structure 1201 may be bonded to the front plate 102 through the optically transparent adhesive member 302 in the opening 1011 of the display 101. The aperture structure 1201 may be disposed between the front plate 102 and the at least one lens 355 (e.g., plural lenses 351, 352 and 353 in FIG. 3A) of the camera device 105. The aperture structure 1201 may include a transparent body 1210 or a light shielding film 1220.

In one embodiment, the transparent body 1210 may include a first surface 1211 facing the front plate 102, a second surface 1212 disposed on the opposite side of the first surface 1211 and facing the at least one lens 355 of the camera device 105, and a side surface 1213 between the first surface 1211 and the second surface 1212. The first surface 1211 may include a curved surface convex toward (e.g., in the positive z-axis direction) the front plate 102. The side surface 1213 may include a curved surface convex in the y-axis direction. In one embodiment, the first surface 1211 and the side surface 1213 may be seamlessly connected. For example, the first surface 1211 and the side surface 1213 may be implemented to have substantially the same curvature. The transparent body 1210 has a different shape from, for example, the transparent body 310 in FIG. 3A but may play substantially the same role. The light shielding film 1220 may be disposed on the side surface 1213 of the transparent body 1210, preventing light from passing through the side surface 1213 of the transparent body 1210. The light shielding film 1220 has a different shape from the light shielding film 320 in FIG. 3A but may play substantially the same role.

In one embodiment, the structure in which the transparent body 1210 has a shape that becomes narrow in the positive z-axis direction and the side surface 1213 of the transparent body 1210 includes a curved surface may contribute to preventing external light reaching the at least one lens 355. The above structure may limit the angle or range of incidence for external light to pass through the gap G1 between the light shielding layer 390 and the light shielding film 1220, which may then reduce the possibility that external light is reflected from the side surface (e.g., inner side surface 1012) of the recess 333 and passes through the gap G between the rear surface (not shown) of the display 101 and the second surface 1212 of the transparent body 1210.

In one embodiment, the optically transparent adhesive member 302 may be disposed so that substantially the whole of the first surface 1211 is bonded to the front plate 102. For example, the whole of the first surface 1211 may be in contact with the optically transparent adhesive member 302. When the first surface 1211 includes an exposed region where the optically transparent adhesive member 302 is not disposed, there may be light loss due to phenomena such as reflection or refraction in the exposed region, and thus the light reception and detection performance of the image sensor 380 (see FIG. 3A) for external light may be deteriorated. In one embodiment, the optically transparent adhesive member 302 may bond the whole of the first surface 1211 and the front plate 102 between the first surface 1211 and the front plate 102 to thereby secure the light reception and detection performance of the image sensor. The structure in which the whole of the first surface 1211 of the transparent body 1210 is bonded to the front plate 102 through an optically transparent adhesive member 302 to secure the light reception and detection performance of the image sensor may be applied to the embodiment of FIG. 3A, the embodiment of FIG. 3B, the embodiment of FIG. 6, the embodiment of FIG. 7, the embodiment of FIG. 9, the embodiment of FIG. 10, or the embodiment of FIG. 11.

In various embodiments, the optically transparent adhesive member 302 may cover some of the light shielding film 1220. In various embodiments (not shown), the optically transparent adhesive member 302 may be expanded to further cover a portion of the light shielding layer 390. For example, the optically transparent adhesive member 302 (e.g., OCR or SVR) may be flowed to cover some of the light shielding layer 390 or light shielding film 1220 when the aperture structure 1201 is pressed toward the front plate 102.

In various embodiments, a light shielding material (e.g., light shielding material 3200 in FIG. 3B) may be filled in the recess 333. In this case, the light shielding film 1220 may be omitted.

In various embodiments, the aperture structure 901 of FIG. 9, the aperture structure 1001 of FIG. 10, the aperture structure 1101 of FIG. 11, or the aperture structure 1201 of FIG. 12 may be molded through a manufacturing process that is at least similar or substantially identical to that described with reference to FIGS. 8A, 8B, 8C, 8D, and 8E.

According to an embodiment of the disclosure, an electronic device (e.g., electronic device 100 in FIG. 3A) may include: a transparent plate (e.g., front plate 102 in FIG. 3A); a display (e.g., display 101 of FIG. 3A) disposed under the transparent plate and including an opening (e.g., opening 1011 in FIG. 3A); an optical sensor (e.g., image sensor 380 in FIG. 3A) aligned under the opening; a transparent body (e.g., transparent body 310 in FIG. 3A) that is extended from a first surface (e.g., first surface 311 in FIG. 3A) facing the transparent plate to a second surface (e.g., second surface 312 in FIG. 3A) disposed on the opposite side of the first surface and facing the optical sensor, and is at least partially disposed in the opening; and a light shielding film (e.g., light shielding film 320 in FIG. 3A) disposed on a side surface (e.g., side surface 313 in FIG. 3A) of the transparent body between the first surface and the second surface.

In one embodiment of the disclosure, the electronic device may further include a transparent adhesive member (e.g., optically transparent adhesive member 302 in FIG. 3A) disposed between the first surface (e.g., first surface 311 in FIG. 3A) and the transparent plate (e.g., front plate 102 in FIG. 3A).

In one embodiment of the disclosure, the transparent adhesive member (e.g., optically transparent adhesive member 302 in FIG. 12) may be in contact with the whole region of the first surface (e.g., first surface 1211 in FIG. 12).

In one embodiment of the disclosure, the electronic device may further include an anti-reflection layer (e.g., anti-reflection layer 630 in FIG. 6) disposed on the second surface (e.g., second surface 612 in FIG. 6).

In one embodiment of the disclosure, the electronic device may further include a ring-shaped light shielding layer (e.g., light shielding layer 390 in FIG. 3A) that is arranged on a rear surface (e.g., rear surface 102b of FIG. 3A) of the transparent plate (e.g., front plate 102 of FIG. 3A) facing the display (e.g., display 101 in FIG. 3A) and is disposed along the edge of the first surface (e.g., first surface 311 in FIG. 3A) when viewed from above the transparent plate.

In one embodiment of the disclosure, the electronic device may further include a transparent adhesive member (e.g., optically transparent adhesive member 340 in FIG. 3A) disposed between the display (e.g., display 101 in FIG. 3A) and the transparent plate (e.g., front plate 102 in FIG. 3A) around the opening (e.g., opening 1011 in FIG. 3A).

In one embodiment of the disclosure, the light shielding layer (e.g., light shielding layer 390 in FIG. 3A) may partially overlap the transparent adhesive member (e.g., optically transparent adhesive member 340 in FIG. 3A) when viewed from above the transparent plate (e.g., front plate 102 in FIG. 3A).

In one embodiment of the disclosure, the light shielding layer (e.g., light shielding layer 390 in FIG. 3A) may surround the first surface (e.g., first surface 311 in FIG. 3A) when viewed from above the transparent plate (e.g., front plate 102 in FIG. 3A).

In one embodiment of the disclosure, the light shielding layer (e.g., light shielding layer 690 in FIG. 6) may cover some of the first surface (e.g., first surface 611 in FIG. 6) when viewed from above the transparent plate (e.g., front plate 102 in FIG. 6).

In one embodiment of the disclosure, pixels (e.g., plural pixels 330a in FIG. 3A) of the display (e.g., display 101 in FIG. 3A) may be arranged so as not to overlap the light shielding layer (e.g., light shielding layer 390 in FIG. 3A) when viewed from above the transparent plate (e.g., front plate 102 in FIG. 3A).

In one embodiment of the disclosure, the display (e.g., display 101 in FIG. 3A) may include a light emitting layer (e.g., light emitting layer 330 in FIG. 3A) including the pixels (e.g., plural pixels 330a in FIG. 3A) based on OLEDs, and an encapsulation layer sealing the light emitting layer. The encapsulation layer may be expanded to cover an inner side surface (e.g., inner side surface 1012 in FIG. 3A) of the opening (e.g., opening 1011 in FIG. 3A).

In one embodiment of the disclosure, the display (e.g., display 101 of FIG. 3A) may include a back plate (e.g., back plate 332 in FIG. 3A) disposed on the rear surface (e.g., fourth surface 101b in FIG. 3A) and including a light shielding material.

In one embodiment of the disclosure, the light shielding film (e.g., light shielding film 720 in FIG. 7) may further include a portion (e.g., circular band portion 721 in FIG. 7) covering some of the first surface along the edge of the first surface (e.g., first surface 711 in FIG. 7).

In one embodiment of the disclosure, the side surface (e.g., side surface 313 in FIG. 3A) of the transparent body (e.g., transparent body 310 in FIG. 3A) may include an inclined surface making an obtuse angle with the first surface (e.g., first surface 311 in FIG. 3A).

In one embodiment of the disclosure, the transparent body (e.g., transparent body 310 in FIG. 3A) may be of a cylindrical shape tapering in a direction from the second surface (e.g., second surface 312 in FIG. 3A) to the first surface (e.g., first surface 311 in FIG. 3A).

In one embodiment of the disclosure, the side surface (e.g., side surface 613 in FIG. 6) of the transparent body (e.g., transparent body 610 in FIG. 6) may be perpendicular to the first surface (e.g., first surface 611 in FIG. 6) or the second surface (e.g., second surface 612 in FIG. 6).

In one embodiment of the disclosure, the transparent body (e.g., transparent body 610 in FIG. 6 or transparent body 710 in FIG. 7) may be of a cylindrical shape.

In one embodiment of the disclosure, the side surface (e.g., side surface 913 in FIG. 9) of the transparent body (e.g., transparent body 910 in FIG. 9) may include a first region (e.g., first region 913a in FIG. 9) connected to the first surface (e.g., first surface 911 in FIG. 9) and making an obtuse angle with the first surface, and a second region (e.g., second region 913b in FIG. 9) connecting between the first region and the second surface (e.g., second surface 912 in FIG. 9) and perpendicular to the first surface.

In one embodiment of the disclosure, the side surface (e.g., side surface 1013 in FIG. 10) of the transparent body (e.g., transparent body 1010 in FIG. 10) may include a first region (e.g., first region 1013a in FIG. 10) connected to the first surface (e.g., first surface 1011a in FIG. 10) and making an obtuse angle with the first surface, and a second region (e.g., second region 1013b in FIG. 10) connecting between the first region and the second surface (e.g., second surface 1012a in FIG. 10) and making an acute angle with the second surface.

In one embodiment of the disclosure, the side surface (e.g., side surface 1113 in FIG. 11) of the transparent body (e.g., transparent body 1110 in FIG. 11) may include a first region (e.g., first region 1113a in FIG. 11) connected to the first surface (e.g., first surface 1111 in FIG. 11) and being in the shape of a curved surface connected to the first surface, and a second region (e.g., second region 1113b in FIG. 11) connecting between the first region and the second surface (e.g., second surface 1112 in FIG. 11) and perpendicular to the second surface.

In one embodiment of the disclosure, the first surface (e.g., first surface 1211 in FIG. 12) of the transparent body (e.g., transparent body 1210 in FIG. 12) may include a curved surface convex toward the transparent plate (e.g., front plate 102 in FIG. 12). The side surface (e.g., side surface 1213 in FIG. 12) of the transparent body (e.g., transparent body 1210 in FIG. 12) may include a curved surface seamlessly connected to the first surface between the first surface and the second surface (e.g., second surface 1212 in FIG. 12).

In one embodiment of the disclosure, the electronic device may further include a light shielding material (e.g., light shielding material 3200 in FIG. 3B) filled between the side surface (e.g., side surface 313 in FIG. 3A) of the transparent body (e.g., transparent body 310 in FIG. 3B) and the inner side surface (e.g., inner side surface 1012 in FIG. 3B) of the opening (e.g., opening 1011 in FIG. 3B).

In one embodiment of the disclosure, the second surface (e.g., second surface 312 in FIG. 3A) may not protrude relative to the display (e.g., display 101 in FIG. 3A) in a direction from the first surface (e.g., first surface 311 in FIG. 3A) to the second surface.

In various embodiments of the disclosure, the second surface (e.g., second surface 312 in FIG. 3A) may protrude relative to the display (e.g., display 101 in FIG. 3A) in a direction from the first surface (e.g., first surface 311 in FIG. 3A) to the second surface.

In one embodiment of the disclosure, the electronic device may further include at least one lens (e.g., plural lenses 351, 352 and 353 in FIG. 3A) disposed between the optical sensor (e.g., image sensor 380 in FIG. 3A) and the second surface (e.g., second surface 312 in FIG. 3A).

In one embodiment of the disclosure, the electronic device may further include an actuator (e.g., AF actuator) to adjust the position of the at least one lens (e.g., plural lenses 351, 352 and 353 in FIG. 3A) in relation to the focal length.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a transparent plate;
   a display disposed under the transparent plate and including an opening;
   an optical sensor aligned under the opening;
   a transparent body extending from a first surface facing the transparent plate to a second surface disposed on an opposite side of the first surface and facing the optical sensor, and at least partially disposed in the opening; and
   a light shielding film disposed on a side surface of the transparent body between the first surface and the second surface.

2. The electronic device of claim 1, further comprising a transparent adhesive member disposed between the first surface and the transparent plate.

3. The electronic device of claim 2, wherein the transparent adhesive member is in contact with an entire region of the first surface.

4. The electronic device of claim 1, further comprising an anti-reflection layer disposed on the second surface.

5. The electronic device of claim 1, further comprising a ring-shaped light shielding layer arranged on a rear surface of the transparent plate facing the display and disposed along an edge of the first surface when viewed from above the transparent plate.

6. The electronic device of claim 5, further comprising a transparent adhesive member disposed between the display and the transparent plate around the opening.

7. The electronic device of claim 6, wherein the light shielding layer partially overlaps the transparent adhesive member when viewed from above the transparent plate.

8. The electronic device of claim 5, wherein the light shielding layer surrounds the first surface when viewed from above the transparent plate.

9. The electronic device of claim 5, wherein the light shielding layer partially overlaps the first surface when viewed from above the transparent plate.

10. The electronic device of claim 5, wherein pixels of the display are arranged so as not to overlap with the light shielding layer when viewed from above the transparent plate.

11. The electronic device of claim 10,
    wherein the display further includes a light emitting layer including the pixels based on organic light emitting diodes (OLEDs), and an encapsulation layer sealing the light emitting layer, and
    wherein the encapsulation layer covers an inner side surface of the opening.

12. The electronic device of claim 1, wherein the display includes a back plate disposed on a rear surface thereof and a light shielding material.

13. The electronic device of claim 1, wherein the light shielding film further includes a portion partially overlapping the first surface along an edge of the first surface.

14. The electronic device of claim 1, wherein the side surface of the transparent body includes an inclined surface making an obtuse angle with the first surface.

15. The electronic device of claim 14, wherein the transparent body is cylindrical and tapers in a direction from the second surface to the first surface.

16. The electronic device of claim 1, wherein the side surface of the transparent body is perpendicular to the first surface or the second surface.

17. The electronic device of claim 16, wherein the transparent body is cylindrical.

18. The electronic device of claim 1, wherein the side surface of the transparent body includes:
    a first region connected to the first surface and making an obtuse angle with the first surface; and
    a second region connecting between the first region and the second surface and perpendicular to the second surface.

19. The electronic device of claim 1, wherein the side surface of the transparent body includes:
    a first region connected to the first surface and making an obtuse angle with the first surface; and a second region connecting between the first region and the second surface and making an acute angle with the second surface.

20. The electronic device of claim 1, wherein the side surface of the transparent body includes:
   a first region connected to the first surface and having a curved surface connected to the first surface; and
   a second region connecting between the first region and the second surface and perpendicular to the second surface.

21. The electronic device of claim 1,
   wherein the first surface of the transparent body includes a curved surface convex toward the transparent plate, and
   wherein the side surface of the transparent body includes a curved surface seamlessly connected to the first surface between the first surface and the second surface.

22. The electronic device of claim 1, further comprising a light shielding material filled between the side surface of the transparent body and an inner side surface of the opening.

23. The electronic device of claim 1, wherein the second surface does not protrude relative to the display in a direction from the first surface to the second surface.

24. The electronic device of claim 1, wherein the second surface protrudes relative to the display in a direction from the first surface to the second surface.

25. The electronic device of claim 1, further comprising at least one lens disposed between the optical sensor and the second surface.

26. The electronic device of claim 25, further comprising an actuator configured to adjust a position of the at least one lens in relation to a focal length.

27. The electronic device of claim 9, wherein the light shielding layer overlaps a peripheral region of the first surface.

28. The electronic device of claim 1, wherein the first surface and the second surface are concentric when viewed from above the transparent plate.

29. The electronic device of claim 1, wherein the opening comprises a notched area in a peripheral edge of the display.

30. The electronic device of claim 1, further comprising a gap between the second surface and a rear surface of the display.

* * * * *